United States Patent
Das et al.

(10) Patent No.: US 9,809,903 B2
(45) Date of Patent: Nov. 7, 2017

(54) METHODS FOR TOP-DOWN FABRICATION OF WAFER SCALE TMDC MONOLAYERS

(71) Applicant: UChicago Argonne, LLC, Chicago, IL (US)

(72) Inventors: Saptarshi Das, State College, PA (US); Mrinal K. Bera, Grenoble (FR); Andreas K. Roelofs, Wheaton, IL (US); Mark Antonio, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 76 days.

(21) Appl. No.: 15/061,696

(22) Filed: Mar. 4, 2016

(65) Prior Publication Data

US 2017/0253996 A1    Sep. 7, 2017

(51) Int. Cl.
| | | |
|---|---|---|
| C25F 5/00 | (2006.01) | |
| C30B 33/10 | (2006.01) | |
| C25F 3/02 | (2006.01) | |
| C30B 29/46 | (2006.01) | |
| C30B 33/04 | (2006.01) | |

(52) U.S. Cl.
CPC ............... *C30B 33/10* (2013.01); *C25F 3/02* (2013.01); *C30B 29/46* (2013.01); *C30B 33/04* (2013.01)

(58) Field of Classification Search
CPC ......... C30B 33/10; C30B 33/04; C30B 29/46; C25F 5/00; C25F 3/02
See application file for complete search history.

(56) References Cited

U.S. PATENT DOCUMENTS

| | | |
|---|---|---|
| 2013/0302593 A1 | 11/2013 | Coleman et al. |
| 2014/0251204 A1* | 9/2014 | Najmaei ............... C30B 25/04 117/95 |
| 2014/0353166 A1 | 12/2014 | Iezzi et al. |
| 2015/0140211 A1 | 5/2015 | Strobl et al. |

OTHER PUBLICATIONS

Dong et al., Spontaneous Exfoliation and Tailoring of MoS2 in mixed solvents, Royal Society of Chemistry, Chem. Commun. 2014 50 15936, Oct. 24, 2014, 4 pages.

* cited by examiner

*Primary Examiner* — Arun S Phasge
(74) *Attorney, Agent, or Firm* — Foley & Lardner LLP

(57) ABSTRACT

A method of forming a TMDC monolayer comprises providing a multi-layer transition metal dichalcogenide (TMDC) film. The multi-layer TMDC film comprises a plurality of layers of the TMDC. The multi-layer TMDC film is positioned on a conducting substrate. The conducting substrate is contacted with an electrolyte solution. A predetermined electrode potential is applied on the conducting substrate and the TMDC monolayer for a predetermined time. A portion of the plurality of layers of the TMDC included in the multi-layer TMDC film is removed by application of the predetermined electrode potential, thereby leaving a TMDC monolayer film positioned on the conducting substrate.

21 Claims, 17 Drawing Sheets

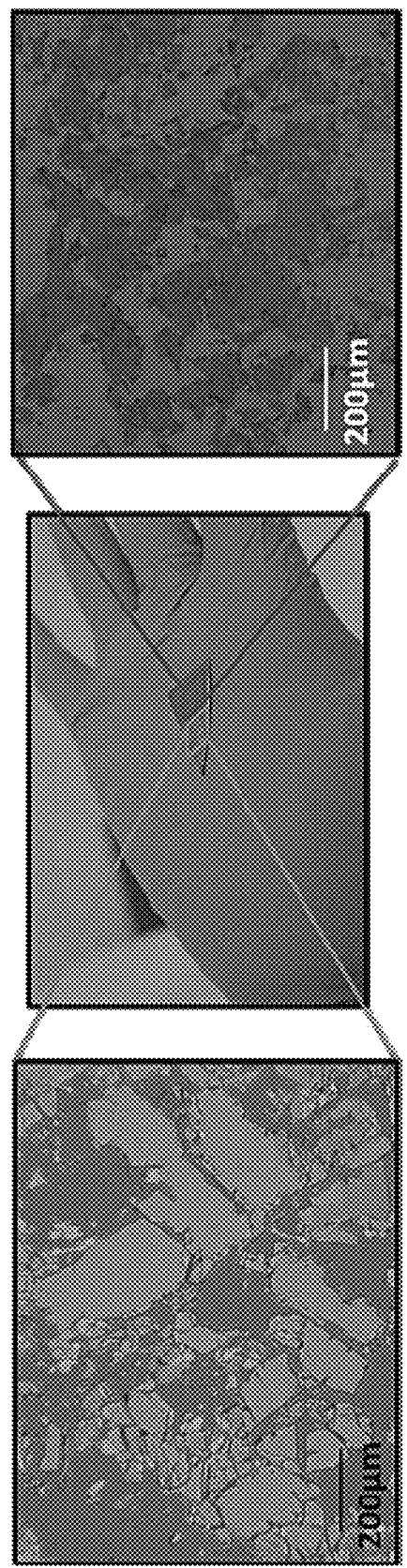

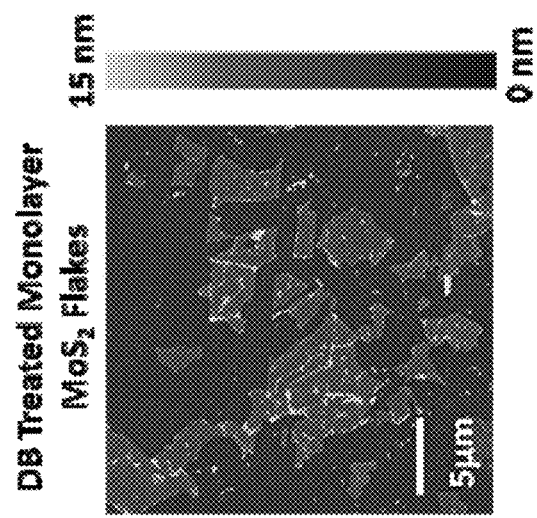
FIG. 5A As Exfoliated Multilayer MoS₂ Flakes
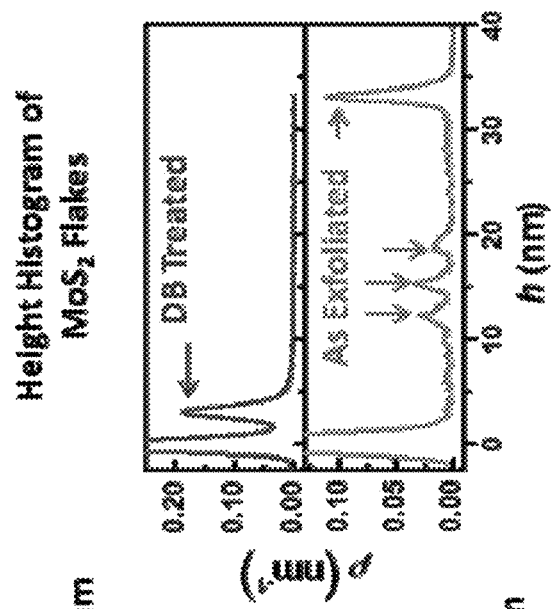
FIG. 5B Height Histogram of MoS₂ Flakes
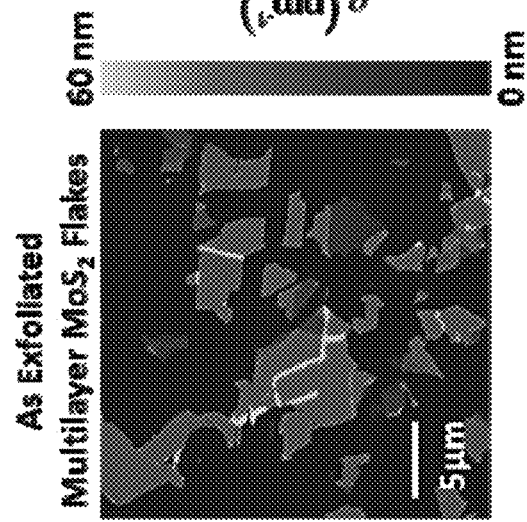
FIG. 5C DB Treated Monolayer MoS₂ Flakes

METHODS FOR TOP-DOWN FABRICATION OF WAFER SCALE TMDC MONOLAYERS

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods for fabricating transition metal dichalcogenide (TMDC) monolayers

BACKGROUND

Two dimensional (2D) materials have received considerable attention due to their extraordinary physical properties like room temperature quantum Hall effect, charge density waves, high temperature superconductivity, superfluidity and high carrier mobility. The unique electrical, mechanical, optical and thermal properties of 2D materials have been utilized in many novel prototype devices and applications. However, the transition of such 2D materials into commercial technologies would require large area scalable and controllable growth of the 2D materials.

Various techniques have been investigated for growth of 2D materials such as chemical vapor deposition (CVD), physical vapor deposition (PVD), molecular beam epitaxy (MBE) and pulsed laser deposition (PLD). However, most of these techniques require expensive instrumentations and resources in terms of chemicals used or process temperature and pressure, which have made such techniques difficult for large scale fabrication of such 2D materials.

SUMMARY

Embodiments described herein relate generally to systems and methods for forming transition metal dichalcogenide (TMDC) monolayers and in particular, to electro-ablation methods for removing a portion of a plurality of TMDC layers from a multi-layer TMDC film positioned on a substrate such that a TMDC monolayer film is left behind on the substrate.

In some embodiments, a method of forming a TMDC monolayer comprises providing a multi-layer transition metal dichalcogenide (TMDC) film. The multi-layer TMDC film comprises a plurality of layers of the TMDC. The multi-layer TMDC film is positioned on a conducting substrate. The conducting substrate and the multi-layer TMDC film are contacted with an electrolyte solution. A predetermined electrode potential is applied on the conducting substrate for a predetermined time. A portion of the plurality of layers of the TMDC included in the multi-layer TMDC film is removed by application of the predetermined electrode potential, thereby leaving a TMDC monolayer film positioned on the conducting substrate.

In some embodiments, a method of forming a transition metal dichalcogenide (TMDC) monolayer comprises obtaining a multi-layer TMDC film from a bulk single crystal TMDC source via mechanical exfoliation. The multi-layer TMDC film comprises a plurality of layers of the TMDC. The multi-layer TMDC film is positioned on a conducting substrate. The conducting substrate and the multi-layer TMDC films are contacted with an electrolyte solution. A predetermined electrode potential is applied on the conducting substrate for a predetermined time. A portion of the plurality of layers of the TMDC included in the multi-layer TMDC film is removed by application of the predetermined electrode potential, thereby leaving a TMDC monolayer film positioned on the conducting substrate.

In some embodiments, a method comprises positioning an adhesive strip over a bulk single crystal TMDC source. The adhesive strip is removed from the bulk single crystal TMDC source such that a TMDC film remains adhered to the adhesive strip. The TMDC film comprises a plurality of multi-layer TMDC flakes. Each multi-layer TMDC flake of the plurality of TMDC flakes comprises a plurality of TMDC layers. The adhesive strip is positioned on a conducting substrate such that the TMDC film contacts the conductive substrate. The conducting substrate is heated to a predetermined temperature for a predetermined heating time. The conducting substrate and the adhesive strip are immersed in a solvent. The solvent is sonicated so as to dissolve the adhesive strip, thereby leaving the TMDC film disposed on the conducting substrate. The conducting substrate and the multi-layer TMDC film are contacted with an electrolyte solution. A predetermined electrode potential is applied on the conducting substrate for a predetermined time. A portion of the plurality of layers of the TMDC included in the multi-layer TMDC film is removed by application of the predetermined electrode potential, thereby leaving a TMDC monolayer film positioned on the conducting substrate.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 4A is an optical image that shows mechanically exfoliated large area molybdenum disulfide ($MoS_2$) flakes on one half and electro-etched monolayer $MoS_2$ flakes on the other half on a conductor coated Si substrate. FIG. 4B-C are optical images of the $MoS_2$ flakes before electro-etching (FIG. 4B) and after electro-etching (FIG. 4C).

FIG. 5A is an atomic force microscopy (AFM) image of the mechanically exfoliated $MoS_2$ flakes of different thicknesses; FIG. 5C is an AFM image of uniformly thick monolayers of $MoS_2$ after the electro-etching; and FIG. 5B are histograms showing the height profiles of the as exfoliated $MoS_2$ flakes and the same $MoS_2$ flakes subjected to the electro-etching treatment.

FIG. 12 panel (a) is a differential pulse voltammetry plot of the conducting TiN substrate with an electrolyte solution (1 M lithium chloride) with different pH values. FIG. 12 panel (b) is a schematic of an electronic structure of the multi-layer $MoS_2$ flake. FIG. 12 panel (c) is a plot obtained from adaptive biasing force-molecular dynamics (ABF-MD) calculations showing the variation in potential of mean force (kcal/mol) in various solvents. FIG. 12 panel (d) are plots of pair distribution function between molybdenum (Mo) and oxygen (O) of solvents (top) and between sulfur (S) and O of solvents (bottom). The overall mechanism of monolayer $MoS_2$ formation via the electro-ablation technique is schematically depicted in FIG. 12 panel (e) and (f).

Figure 1:
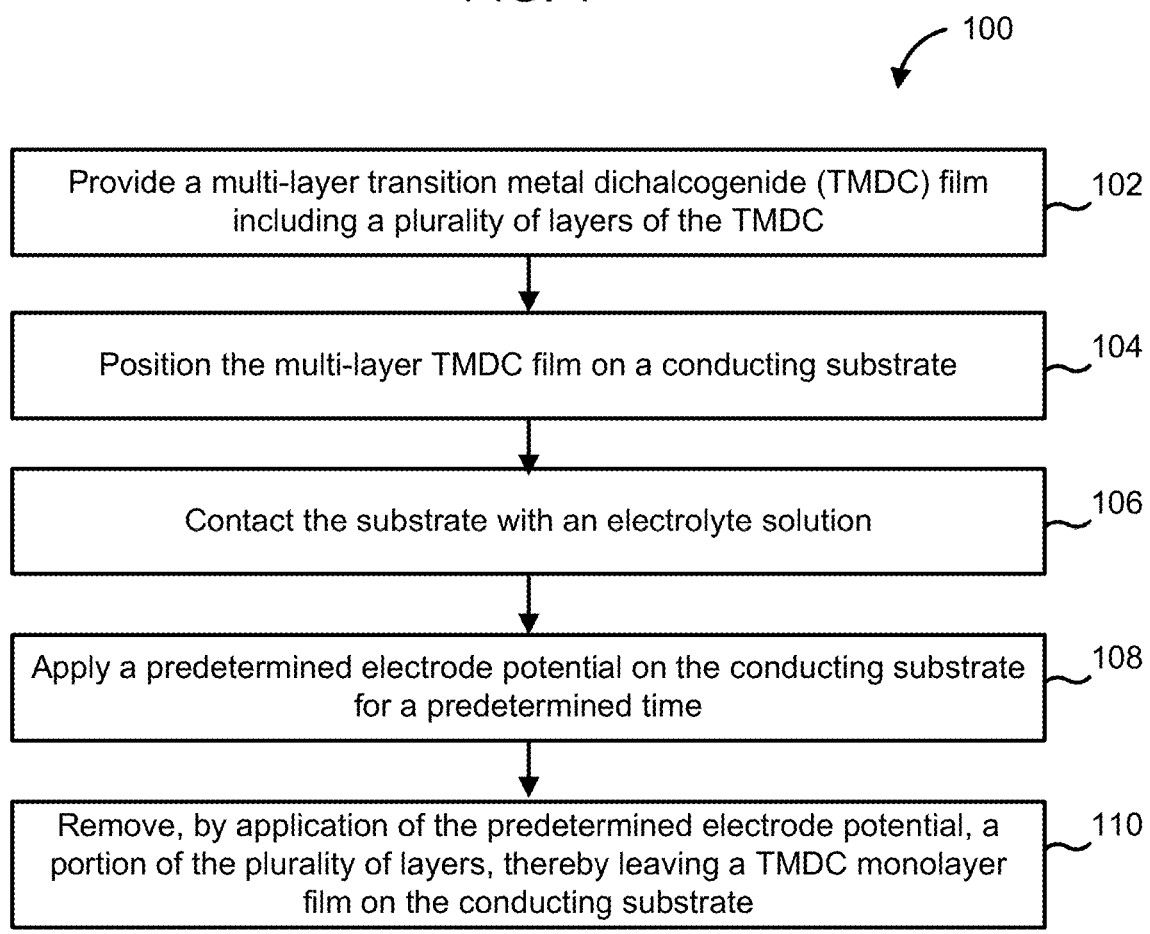
FIG. 1 is a schematic flow diagram of a method of forming TMDC monolayers from multi-layer TMDC films, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to systems and methods for forming transition metal dichalcogenide (TMDC) monolayers and in particular, to electrochemical methods for removing a portion of a plurality of TMDC layers from a multi-layer TMDC film positioned on a substrate such that a uniform TMDC monolayer film is left behind on the substrate.

The interest in two dimensional (2D) materials (e.g., 2D transition metal dichalcogenide (TMDC) materials) is rapidly spreading across all scientific and engineering disciplines due to their exceptional properties which not only provide a platform to investigate intriguing physical phenomena but also promise solutions to the most relevant technological challenges. Silicon has been at the forefront of technological evolution for the last several decades. However, with the emergence of the era of Internet of Things (IoT), there is a need for new materials to meet the ever increasing demand of new functionalities. In this context, 2D materials have great promise and may find application in flexible electronics, optoelectronics as well as digital electronics. Significant improvements using 2D materials have already been demonstrated in field effect transistors, gas sensors, bio-detectors, mechanical resonators, optical modulators and energy harvesting devices with superior performances.

One of the major challenges towards the large scale adoption and commercialization of 2D material based technologies is the large area, scalable and controllable growth of highly crystalline 2D materials in a cost effective way. Chemical vapor deposition (CVD) may be used to grow large area 2D materials. However, the success of CVD is dependent on availability of precursors and optimized conditions like temperature, pressure, air flow etc. Also the CVD grown samples may suffer from polycrystallinity and non-uniform thicknesses which ultimately limits the performance. Other techniques include molecular beam epitaxy (MBE), pulsed laser deposition (PLD) and atomic layer deposition (ALD) but are complex, cost inhibitive and still in their infancy. Micromechanical exfoliation of 2D material films from naturally occurring single crystals may also be used but generally produces randomly distributed flakes of different thicknesses ranging from mono-layers (~0.6 nm) to few layers (~50-100 nm). The lateral dimensions of the flakes are also limited to only few micrometers.

Embodiments of the systems and methods described herein for reducing a multi-layer TMDC films to obtain a TMDC monolayer film may provide several benefits including, for example: (1) allowing reduction of a multi-layer TMDC film having any thickness, size or number of TMDC layers in a TMDC monolayer film having a uniform thickness; (2) allowing processing within 5-60 seconds which is about 100 times faster than generally used bottom up techniques for forming TMDC monolayer; (3) providing a yield of about 100%; (4) producing large area TMDC films or flakes, for example of about 0.4 mm, which is only limited by the size of the conducting substrate on which the electro-etching or electro-ablation process is performed; (5) providing energy efficiency by allowing operation at a voltage of less than 2.0 Volts; (6) allowing processing at room temperature; and (7) finding application in numerous semiconductor devices such as flexible electronics, digital electronics, optoelectronics and solid state sensors and detectors to name a few.

FIG. 1 is a schematic flow diagram of an example method 100 for forming a TMDC monolayer according to an embodiment. The method 100 includes providing a multi-layer TMDC film which comprises a plurality of layer of the TMDC at 102. The multi-layer TMDC film may be obtained using any suitable method. For example, the multi-layer TMDC film may be obtained via mechanical exfoliation (e.g., scotch tape exfoliation or via the method shown in FIG. 2 described in detail herein), shearing, CVD, or any other suitable method. The multi-layer TMDC film may include a continuous film or a plurality of flakes of the TMDC.

The TMDC may include any material having the chemical formula:

$$MX_2$$

where M is a transition metal such as molybdenum, scandium, titanium, tungsten, chromium, manganese, iron, cobalt, nickel, copper, zinc, vanadium, or any other transition metal, and X is a chalcogen atom, for example sulfur, selenium and tellurium.

In some embodiments, the multi-layer TMDC film may include molybdenum disulfide ($MoS_2$), tungsten disulfide ($WS_2$), tungsten diselenide ($WSe_2$) or molybdenum ditelluride ($MoTe_2$). For example, the TMDC may include molybdenum disulfide ($MoS_2$). $MoS_2$ is a direct band-gap material when it is in monolayer form, and has a bandgap of about 1.9 electron Volts (eV). It is a naturally n-type material with carrier mobilities which may be as high as 450 cm$^2$/V-s. It has a high current density of about $5 \times 10^7$ amperes per cm$^2$, which may be extended even further based on the substrate it's in contact with. It is stable at high temperature, has stiffness greater than steel, and is flexible and transparent. Moreover, $MoS_2$ may demonstrate ambipolar characteristics which are suitable for forming electronic devices.

The multi-layer TMDC film is positioned on a conducting substrate at 104. In some embodiments, the conducting substrate may include an element (e.g., a metal) having a strong covalent interaction with the TMDC (e.g., the chalcogenide atoms included in the TMDC), such as stronger than the van der Waals interactions between the plurality of layers of TMDC forming the multi-layer TMDC film. The strong covalent interaction may cause a monolayer of the TMDC included in the multi-layer TMDC film to adhere to or be covalently coupled to the conducting substrate with a coupling force which is stronger than the van der Waals force between the plurality of TMDC layers of the multi-layer TMDC film. In some embodiments, the conducting substrate may include titanium nitride (TiN). In other embodiments, the substrate may also include without limitation titanium tungstate (TiW), tungsten nitride (WN), zirconium nitride (ZrN), niobium nitride (NbN), tantalum nitride (TaN), other binary nitrides, ternary nitrides or any other combination thereof.

In some embodiments, the multi-layer TMDC film may have a surface coverage of greater than 75% on the conducting substrate. The conducting substrate can have any shape or size (e.g., a sheet, a block, a wafer, etc.). In various embodiments, the conducting substrate may include a conducting foil or a conducting film deposited on a substrate, for example a TiN film evaporated (e.g., evaporated using electron-beam or thermal evaporation), sputtered or otherwise electroplated on the substrate.

The conducting substrate and the multi-layer TMDC film is contacted with an electrolyte at 106. For example, the conducting substrate with the multi-layer TMDC film is immersed in an electrolyte. The electrolyte solution may include an alkali metal salt, for example lithium chloride, lithium nitride, sodium chloride, potassium chloride, potassium iodide, or any other alkali metal salt or a combination thereof. Alkali metal ions like lithium, sodium and potassium may intercalate inside the interlayer space between the plurality of layers of the multi-layer TMDC resulting in an expanded lattice. This may weaken the van der Waals force between the plurality of layers of the TMDC, thereby facilitating electro-etching or removal of a portion of the plurality of layers (e.g., monolayers) of the TMDC from the multi-layer TMDC film, as described herein. In some embodiments, the electrolyte solution may include a dilute acid, for example a dilute hydrochloric acid, nitric acid, sulfuric acid, hydrofluoric acid, etc.

A predetermined electrode potential is applied for a predetermined time on the conducting substrate at 108. For example, a reference electrode (e.g., a silver/silver chloride (Ag/AgCl) reference electrode or a standard hydrogen electrode) and/or an auxiliary electrode (e.g., a graphite sheet, wire or mesh electrode) may also be immersed in the electrolyte and the conducting substrate polarized at the predetermined electrode potential with respect to the reference electrode.

A portion of the plurality of layers of the TMDC included in the multi-layer TMDC film is removed by application of the predetermined electrode potential, thereby leaving a TMDC monolayer film positioned on the conducting substrate at 110. In some embodiments, the predetermined electrode potential is greater than an oxidation potential of water to hydrogen peroxide, for example in the range of 0.5 Volts to 2.2 Volts (e.g., 0.5, 0.6, 0.7, 0.8, 0.9, 1.0, 1.1, 1.2, 1.3, 1.4, 1.5, 1.6, 1.7, 1.8, 1.9, 2.0, 2.1 or 2.2 Volts with respect to Ag/AgCl electrode, inclusive of all ranges and values there between). In some embodiment, the predetermined time is in the range of 5-60 seconds (e.g., 5, 10, 15, 20, 25, 30, 35, 40, 45, 50, 55 or 60 seconds inclusive of all ranges and values therebetween). In some embodiments, the pH of the electrolyte solution may have a pH in the range of 0.5 to 3 (e.g., 0.5, 0.6, 0.7, 0.8, 0.9, 1.0, 1.2, 1.4, 1.6, 1.8, 2.0, 2.2, 2.4, 2.6, 2.8 or 3.0 inclusive of all ranges and values therebetween).

Expanding further, the polarizing of the conducting substrate at the predetermined electrode potential electro-etches or electro-ablates the portion of the plurality of layers of the TMDC included in the multi-layer TMDC film. The portion includes all of the plurality of layers of the TMDC except the TMDC monolayer directly in contact with the conducting substrate. The strong covalent interaction between the conducting substrate (e.g., TiN) and the TMDC (e.g., $MoS_2$) monolayer film in contact with the conducting substrate (e.g., −1.25 eV, vide infra) is much greater than the weak van der Waals interaction between the rest of the TMDC monolayers (e.g., −0.16 eV, vide infra) included in the multi-layer TMDC film. Therefore, the plurality of TMDC films are electro-etched or electro-ablated in the electrolyte leaving the TMDC monolayer disposed on the conducting substrate.

In some embodiments, the predetermined electrode potential, the pH and/or composition of the electrolyte solution, and/or the predetermined time may be adjusted so as to obtain a bi-layer, a tri-layer or otherwise a predetermined number of layers of the TMDC on the conducting substrate via controller electro-ablation of the multi-layer TMDC. For example, the predetermined time may be controlled such that the electro-ablation is stopped once a set number of TMDC layers are removed from the multi-layer TMDC so as to leave the predetermined number of layers remaining on the conducting substrate.

The multi-layer TMDC film has a first thickness and the TMDC monolayer film has a second thickness smaller than the first thickness. For example, the first thickness of the multi-layer TMDC film may be greater than 1 nm (e.g., 10, 20 30, 40, 50, 60, 70, 80, 90 or 100 nm or even 1 μm inclusive of all ranges and values there between). Furthermore, the second thickness of the TMDC monolayer film may be less than 1 nm corresponding to the thickness of a TMDC monolayer, irrespective of the first thickness of the multi-layer TMDC film. Therefore, a multi-layer TMDC film having any thickness is reduced to a TMDC monolayer film having a uniform thickness using the method 100.

Figure 2:
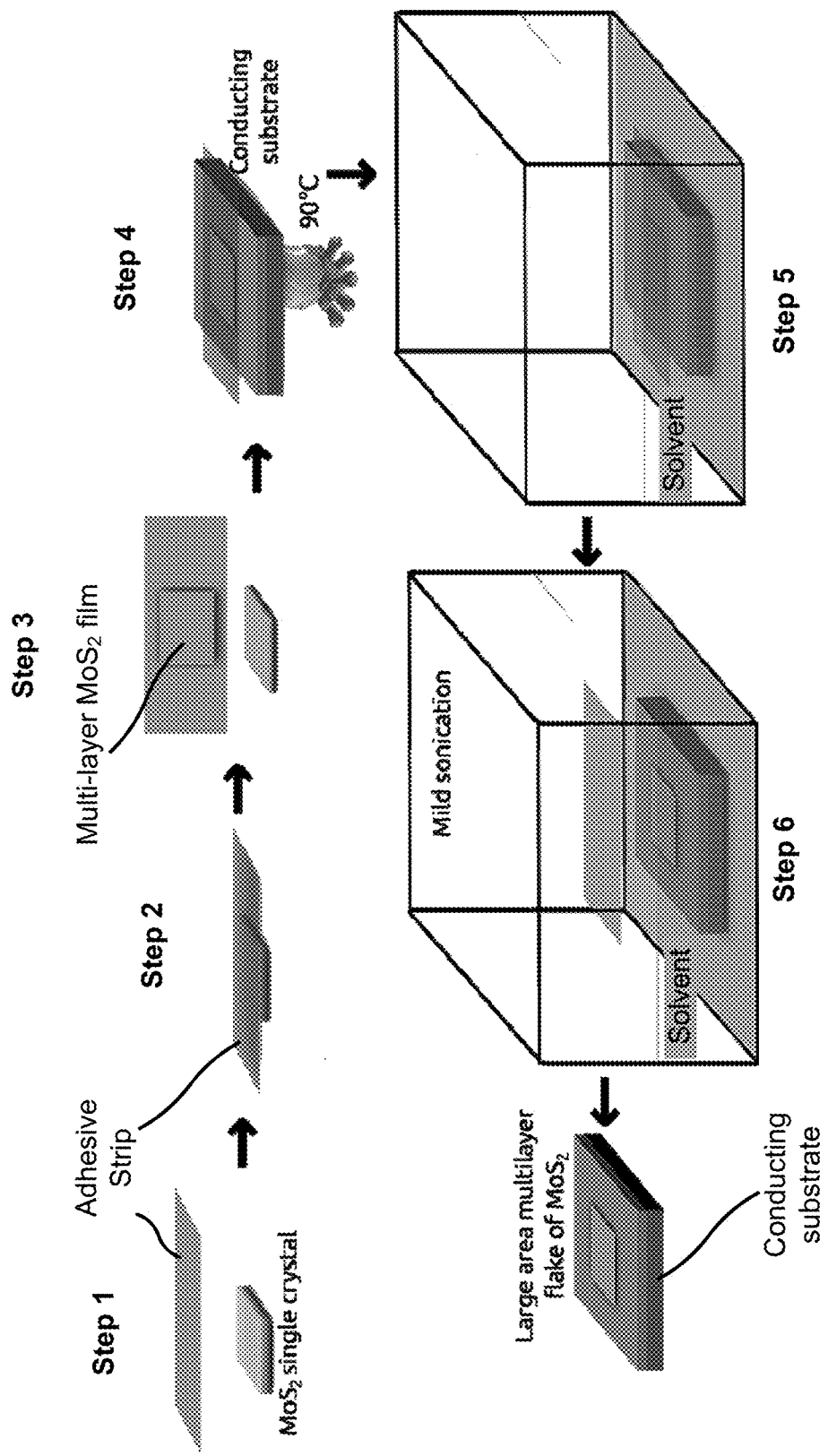
FIG. 2 is a schematic illustration of a process flow for mechanically exfoliating a multi-layer TMDC film from a bulk single crystal TMDC source, according to an embodiment.

FIG. 2 is a schematic illustration of a process flow for mechanically exfoliating a multi-layer TMDC film comprising $MoS_2$ from a bulk single crystal TMDC source, according to an embodiment. It should be appreciated that while the process is described specifically for mechanically exfoliating $MoS_2$ multi-layer film, the process is general purpose and can be used for mechanically exfoliating any multi-layer film from a bulk material (e.g., a bulk single crystal TMDC source).

The process starts with a bulk single crystal $MoS_2$ source, for example a block, a wafer or a sheet of $MoS_2$. In some embodiments, the $MoS_2$ source may include a 1 cm×1 cm $MoS_2$ single crystal. At step 1, an adhesive strip (e.g., a scotch tape, mending tape, clear tape, etc.) is provided. At step 2 the adhesive strip is positioned on the bulk single crystal $MoS_2$ source. For example, a surface of the adhesive strip on which an adhesive is disposed is pressed down on the bulk single crystal $MoS_2$ source.

At step 3, the adhesive strip is removed (e.g., gently peeled) from the bulk single crystal $MoS_2$ source such that a TMDC film remains adhered to the adhesive strip. The TMDC film comprises a plurality of multi-layer TMDC flakes. Each multi-layer TMDC flake of the plurality of TMDC flakes comprises a plurality of TMDC layers. Repeated folding of the adhesive strip may be avoided so as to prevent disintegration of the multi-layer $MoS_2$ flakes forming the multi-layer TMDC film.

At step 4, the adhesive strip is positioned on a conducting substrate such that the multi-layer $MoS_2$ film contacts the conducting substrate. In some embodiments, the conducting substrate may include TiN but any other suitable conducting substrate may be used like ZrN, NbN, TaN, TiW, WN, etc. The conducting substrate may include a flat substrate, for example a flat electrode, a film or a foil of a conducting material disposed on a substrate. The conducting substrate may be heated (e.g., on a hot plate or in an oven) at a predetermined temperature (e.g., 80, 90 or 100 degrees Celsius inclusive of all ranges and values there between or any other suitable temperature) for a predetermined heating time (e.g., 30 seconds, 1 minute, 1.5 minutes or 2 minutes inclusive of all ranges and values there between). The heating may promote the covalent interaction between the conducting substrate and a $MoS_2$ monolayer film included in the multi-layer $MoS_2$ film as described before.

At step 5, the conducting substrate and the adhesive strip are immersed in a solvent. At step 6, the conducting substrate is sonicated (e.g., ultrasonicated) so as to dissolve the adhesive strip and leave the multi-layer TMDC film positioned on the conducting substrate. For example, the solvent may include acetone or any other solvent configured to dissolve the adhesive of the adhesive strip (e.g., scotch tape, mending tape, clear tape, etc.). The sonication may be for a very short time (e.g., less than 5 seconds) and may facilitate dissolution of the adhesive and removal of the adhesive strip from the conducting substrate, leaving behind large area $MoS_2$ flakes covering the surface of the conducting substrate. In some embodiments, a surface coverage of the $MoS_2$ flakes on the conducting substrate may be greater than 75% (e.g., 80%, 85%, 90%, 95% or 100% inclusive of all ranges and values therebetween).

Figure 3:
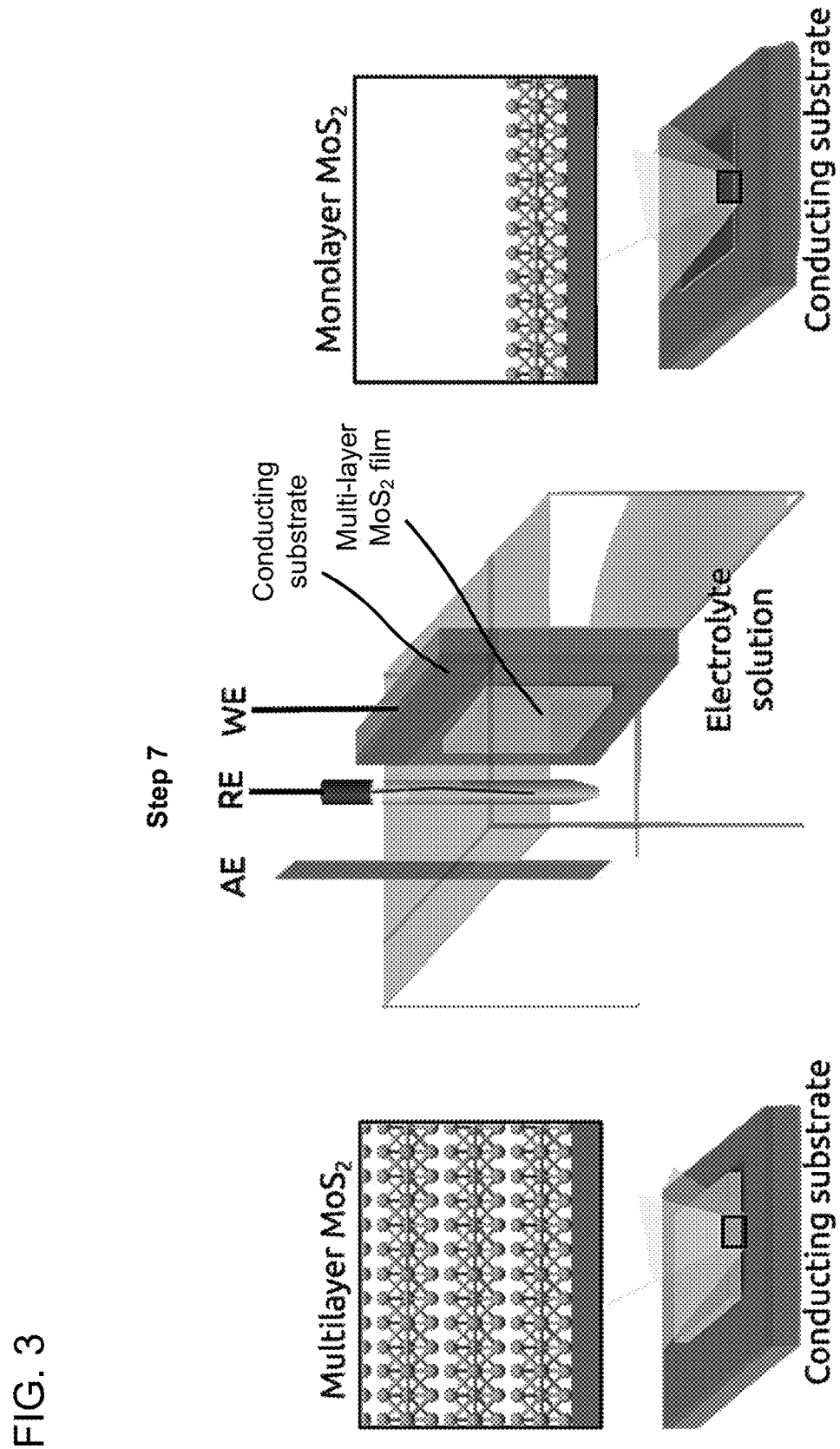
FIG. 3 is a schematic illustration of an electrochemical process for obtaining a TMDC monolayer film from the mechanically exfoliated multi-layer TMDC film of FIG. 2 or any other multi-layer TMDC film.

The mechanically exfoliated multi-layer $MoS_2$ films may then be electro-etched or electro-ablated so as to obtain a $MoS_2$ monolayer film. Referring also now to FIG. 3, at step 7, the conducting substrate (WE) with the multi-layer $MoS_2$ film positioned thereon is contacted with an electrolyte, for example immersed in an electrolyte. The electrolyte solution may include an alkali metal salt, for example lithium chloride, lithium nitride, sodium chloride, potassium chloride, potassium iodide, or any other alkali metal salt or any combination thereof, as described previously with respect to the method 100. In some embodiments, the concentration of the alkali metal salt (e.g., lithium chloride) in the electrolyte may be about 1 molar. A reference electrode (RE), for example a silver/silver chloride (Ag/AgCl) reference electrode or a standard hydrogen electrode, and an auxiliary electrode (AE) (e.g., a carbon electrode) is also immersed in the electrolyte. In some embodiments, the electrolyte solution may include a dilute acid, for example a dilute hydrochloric acid, nitric acid, sulfuric acid, hydrofluoric acid, etc.

A predetermined electrode potential is applied for a predetermined time on the conducting substrate with respect to the reference electrode (e.g., a Ag/AgCl reference electrode). A portion of the plurality of layers of the $MoS_2$ included in the multi-layer $MoS_2$ film is removed by application of the predetermined electrode potential, thereby leaving a $MoS_2$ monolayer film positioned on the conducting substrate. In some embodiments, the predetermined electrode potential is greater than an oxidation potential of water to hydrogen peroxide, for example in the range of 0.5 Volts to 2.2 Volts (e.g., 0.5, 0.6, 0.7, 0.8, 0.9, 1.0, 1.1, 1.2, 1.3, 1.4, 1.5, 1.6, 1.7, 1.8, 1.9, 2.0, 2.1 or 2.2 Volts with respect to Ag/AgCl reference electrode, inclusive of all ranges and values therebetween). In some embodiment, the predetermined time is in the range of 5-60 seconds (e.g., 5, 10, 15, 20, 25, 30, 35, 40, 45, 50, 55 or 60 seconds inclusive of all ranges and values therebetween). In some embodiments, the pH of the electrolyte solution may have a pH in the range of 0.5 to 3 (e.g., 0.5, 0.6, 0.7, 0.8, 0.9, 1.0, 1.2, 1.4, 1.6, 1.8, 2.0, 2.2, 2.4, 2.6, 2.8 or 3.0 inclusive of all ranges and values therebetween).

FIG. 4A-C are optical images of mechanically exfoliated large area $MoS_2$ flakes on a conducting substrate (FIG. 4A) before electro-etching (FIG. 4B) and after electro-etching (FIG. 4C). The multi-layer $MoS_2$ flakes were mechanically exfoliated using the process shown in FIG. 2 and had a surface coverage on the conducting substrate of greater than 75%. The conducting substrate includes a 100 nm film of TiN deposited on a silicon substrate. FIG. 4B shows the plurality of $MoS_2$ flakes positioned on the TiN substrate. A portion of the multi-layer $MoS_2$ flakes are electro-etched or electro-ablated by immersing a portion of the conducting substrate in a 1 Molar lithium chloride electrolyte solution. An electrode potential of about 1.6 Volts with reference to a Ag/AgCl reference electrode was applied the conducting substrate for a time of about 5-60 seconds.

FIG. 4B shows the optical micrographs of exfoliated $MoS_2$ flakes before electro-ablation and FIG. 4C shows the optical micrographs of exfoliated $MoS_2$ flakes after the electro-ablation treatment. The optical contrast of FIG. 4B suggests that the untreated portion of the substrate is covered with multi-layered $MoS_2$ flakes of variable thicknesses, whereas the treated portion is covered with $MoS_2$ flakes of uniform thickness (FIG. 4C). Raman shift and photoluminescence characterization confirmed that the uniform layers are, in fact, monolayers of $MoS_2$. The lateral dimension of the monolayer $MoS_2$ flakes obtained through the electro-ablation technique has no fundamental limitation since it is dependent on the size of the multilayer $MoS_2$ flakes obtained from micromechanical exfoliation.

FIG. 5A is an AFM image of the mechanically exfoliated $MoS_2$ flakes of different thicknesses and the uniformly thick monolayers of $MoS_2$ after electro-etching (FIG. 5C) along with the histograms of the height profiles before and after electro-etching (FIG. 5B). Multiple peaks are positioned at approx. 12, 16, 19 and 34 nm in the height histogram (FIG. 5B) corresponding to the AFM image of the as-exfoliated $MoS_2$ flakes (the substrate peak is centered at zero). This random height distribution is a natural outcome of the mechanical exfoliation technique.

However, after the electro-ablation treatment, all of these peaks collapse into a single peak corresponding to a height of 2.5 nm, which includes a height of the $MoS_2$ monolayer (about 1 nm) as a sidewall of a shallow groove formed in the TiN conducting substrate (about 1.5 nm) around the $MoS_2$ due to slight etching of the TiN. This indicates that the initial $MoS_2$ flake thickness is inconsequential for the electro-ablation technique, which transforms any thicknesses of multilayered $MoS_2$ flakes into layers of 2.5 nm thickness (including the height of the sidewall of the shallow groove in the TiN). Furthermore, multi-layer $MoS_2$ flakes having various thicknesses in the range of hundreds of nm were planarized down to 2.5 nm using the electro-ablation technique described herein.

The 2.5 nm thickness of the electro-ablation treated $MoS_2$ monolayer may be due to the time-dependent weak etching of the exposed part of the conducting TiN substrate that increases the effective height of the monolayer. The FWHM (full width at half max) of approximately 1 nm associated with the monolayer peak at 2.5 nm (and also with the multilayer peaks) in the AFM height histogram is directly attributable to the TiN substrate (with an essentially identical FWHM) rather than non-uniformity of the flakes.

Figure 6B:
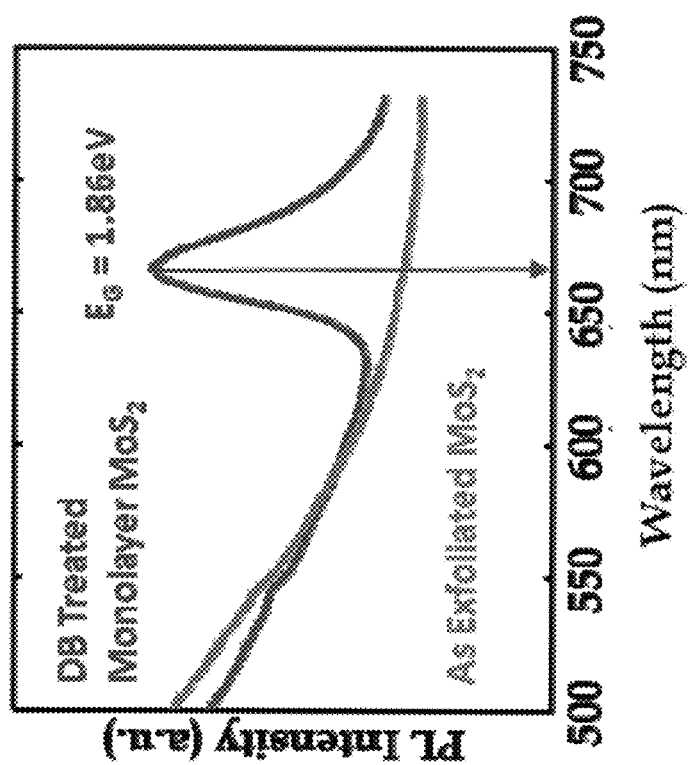
FIG. 6A is a plot of Raman data and FIG. 6B is a plot of photoluminescence data collected from the mechanically exfoliated multilayers of $MoS_2$ and the monolayers obtained by applying the method of FIG. 3.
Figure 6A:
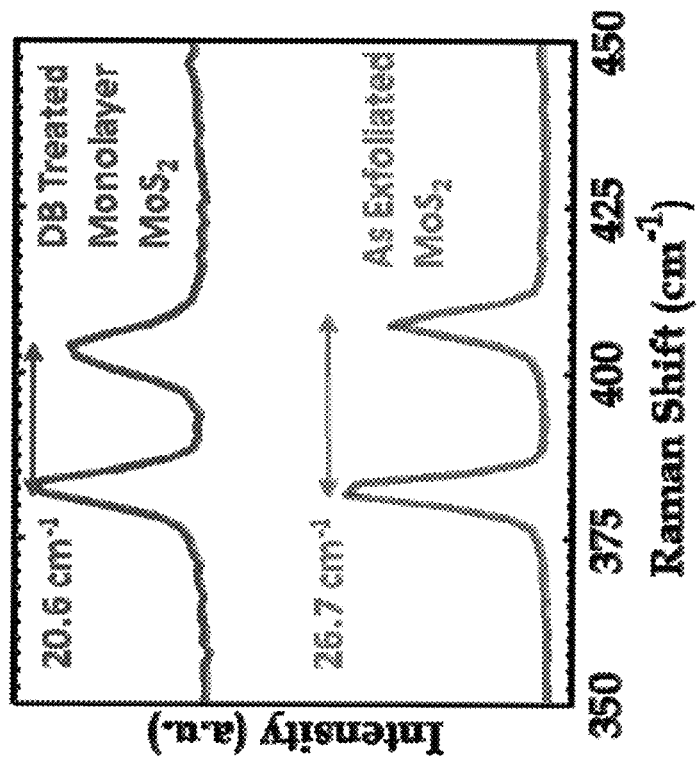

In order to ascertain the number of $MoS_2$ layers left on the electro-ablation treated substrate that corresponds to the thickness of 2.5 nm, Raman spectroscopy and photoluminescence (PL) measurements were performed. FIG. 6A is a plot of Raman data and FIG. 6B is a plot of photoluminescence data collected from the large area mechanically exfoliated multilayers of $MoS_2$ and the monolayers obtained by applying the method of FIG. 3. As observed in the Raman plot of FIG. 6A, the separation between the $A_{1g}$ and $E^1_{2g}$ peaks is reduced from 26.7 $cm^{-1}$ to 20.6 $cm^{-1}$. This suggests that the multilayer $MoS_2$ flake has been converted to monolayer $MoS_2$. Moreover, the photoluminescence data, obtained from electro-ablation treated $MoS_2$ flakes, shown in FIG. 6B, exhibit a peak corresponding to a bandgap energy $E_G$=1.86 eV which is a clear fingerprint of monolayer $MoS_2$.

Figure 7B:
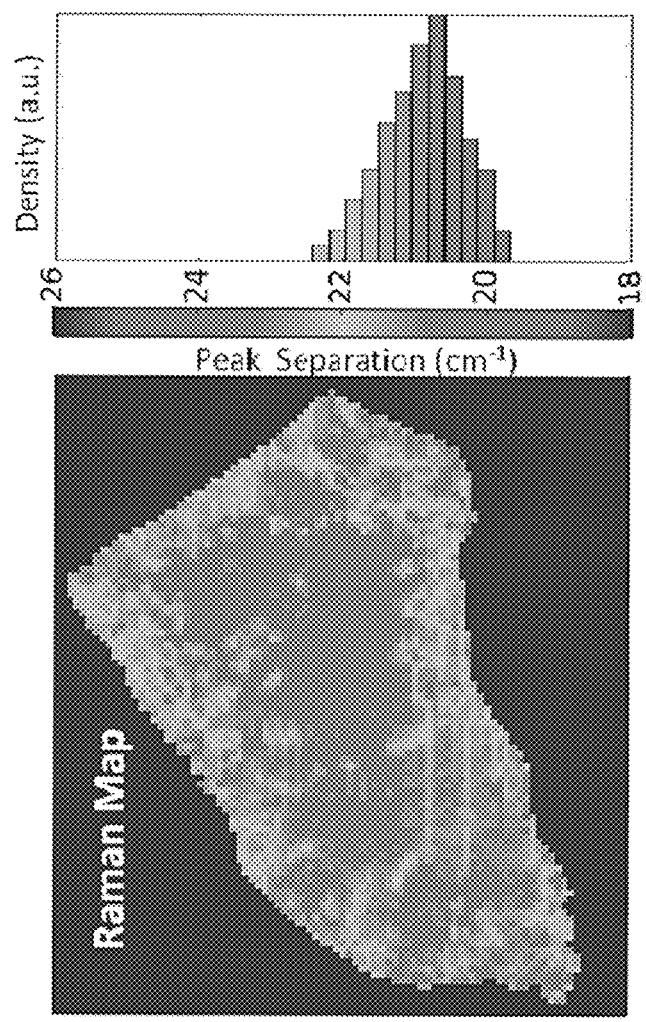
FIG. 7A is an optical image and FIG. 7B is a map of the Raman peak separations along with the histogram collected from a large area monolayer of $MoS_2$ obtained by the method of FIG. 3. The Raman mapping was done at the resolution of 500 nm.
Figure 7A:
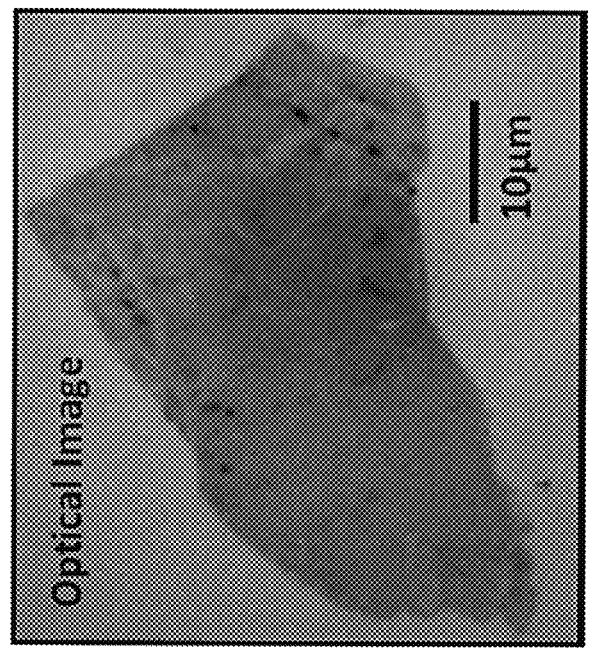
Figure 8B:
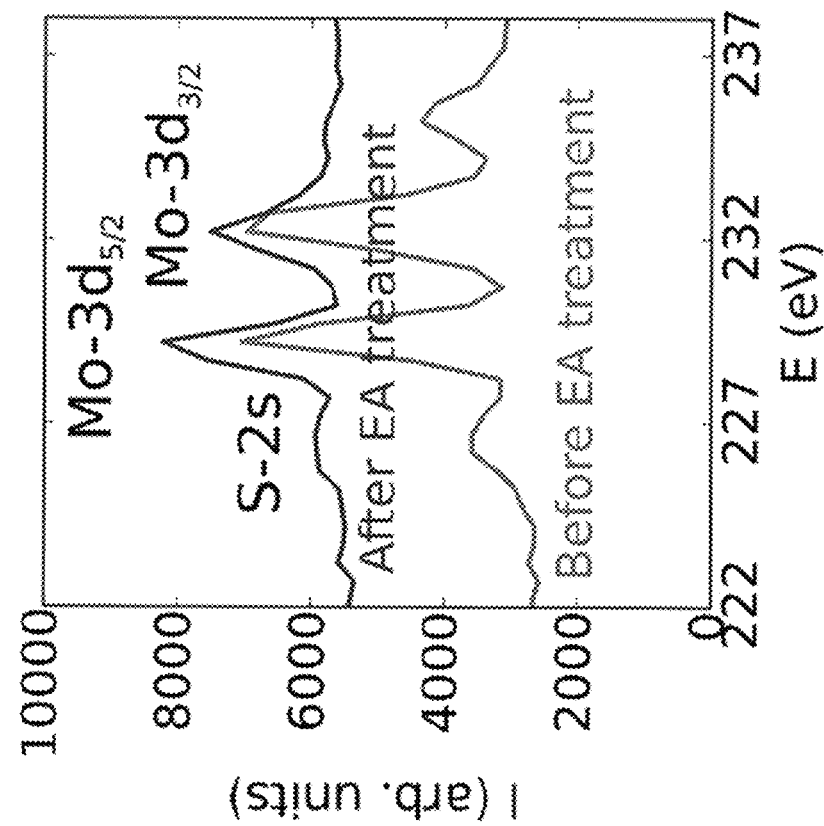
FIG. 8A-B are plots of XPS data collected from $MoS_2$ flakes before and after the application of the electro-ablation technique and show S-2p (FIG. 8A) and Mo-3d (FIG. 8B) peaks from $MoS_2$ flakes.
Figure 8A:
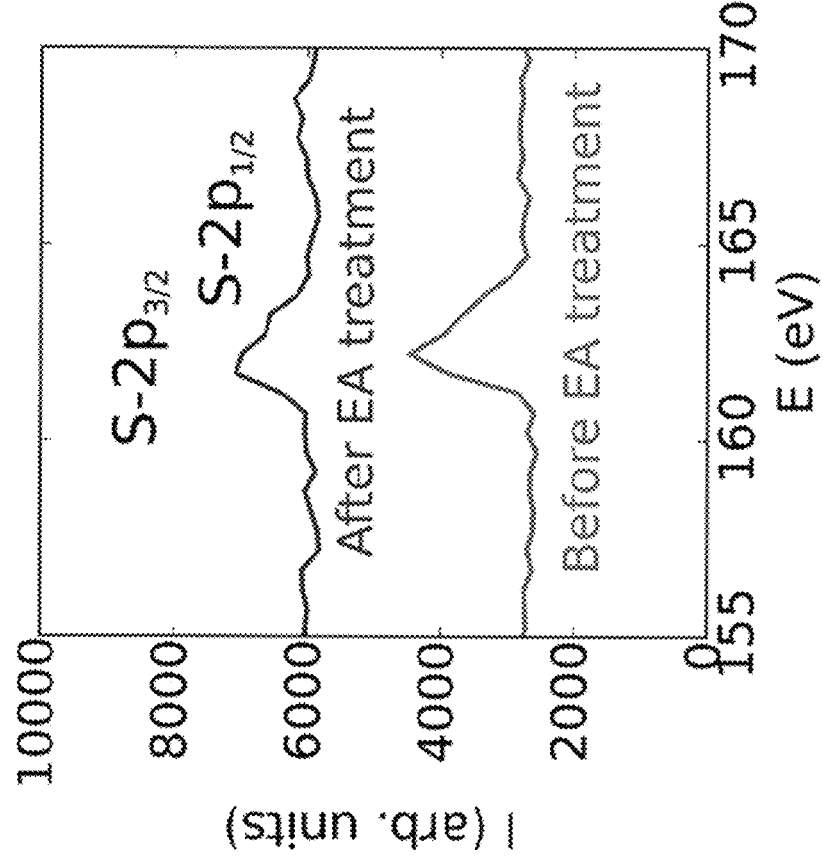

FIG. 7A is an optical image and FIG. 7B is a map of the Raman peak separations along with the histogram collected from a large area monolayer of $MoS_2$ obtained by the method of FIG. 3. The Raman mapping was done at the resolution of 500 nm×500 nm. The uniformity of the $MoS_2$ layers obtained from the treatment was studied through the Raman mapping of a representative flake as shown in FIG. 7B. The distribution of the peak separation has a maximum at approx. 20.6 $cm^{-1}$ corresponding to monolayer $MoS_2$. Because the width of this distribution (approx. 1.0 $cm^{-1}$) is less than the resolution of the Raman instrument (1.6 $cm^{-1}$), it was confirmed that the monolayer $MoS_2$ flakes are uniform. X-ray photoelectron spectroscopy (XPS) was also performed on the $MoS_2$ flakes before and after the application of the electro-ablation technique. FIG. 8A-B are plots of XPS data collected from $MoS_2$ flakes before and after the application of the electro-ablation technique and show S-2p (FIG. 8A) and Mo-3d (FIG. 8B) peaks from $MoS_2$ flakes. The presence of S-2p peaks and Mo-3d peaks at the same energies before and after the electro-ablation treatment shows that the process described herein converted the multilayers of $MoS_2$ to monolayers without affecting their composition or forming any other products of molybdenum and/or sulfur.

Figure 9:
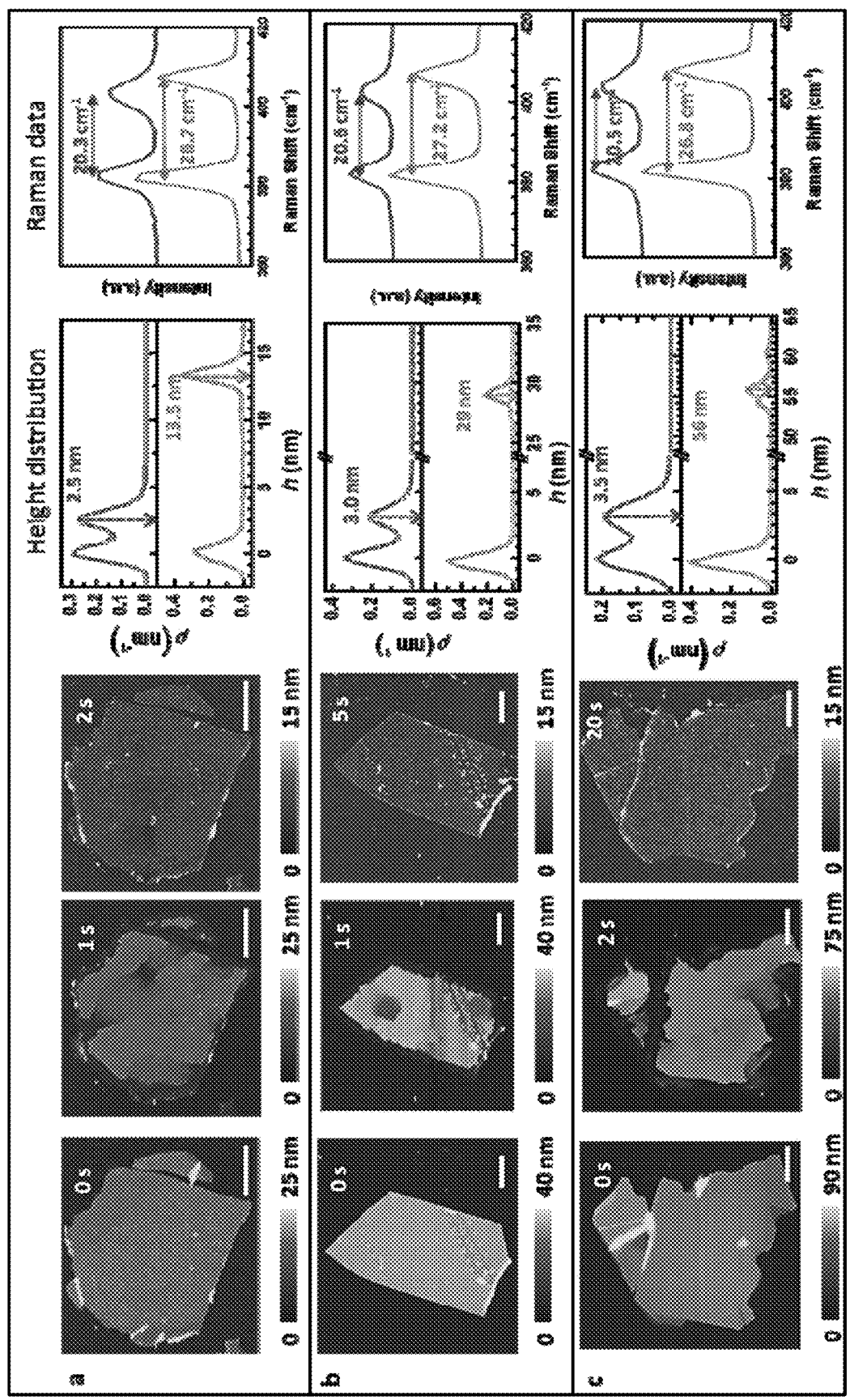
FIG. 9 are thickness dependent time evolution plots of electro-etching of the $MoS_2$ flakes and AFM images of the flakes of different initial thicknesses for 13.5 nm (FIG. 9 panel (a)), 29 nm (FIG. 9 panel (b)) and 56 nm (FIG. 9 panel (c)) $MoS_2$ flakes. The flakes were electro-etched for different durations of time as shown on the right upper corner of the images. The plots on the right side of each panel show height distributions of the AFM images and Raman data collected from the $MoS_2$ flakes are shown.

FIG. 9 are thickness dependent time evolution plots of electro-etching of the $MoS_2$ flakes and AFM images of the flakes of different initial thicknesses for 13.5 nm (FIG. 9 panel (a)), 29 nm FIG. 9 panel (b)) and 56 nm (FIG. 9 panel (c)) $MoS_2$ flakes. The flakes were electro-etched for different duration of time as shown on the right upper corner of the images. The plots on the right side of each panel show height distributions of the AFM images and Raman data collected from the $MoS_2$ flakes are shown.

As shown in FIG. 9 panel (a), a 12 nm thick multi-layer $MoS_2$ flake was fully converted into a monolayer in less than 2 seconds. For comparison, 29 nm (FIG. 9 panel (b)) and 56 nm (FIG. 9(c)) thick multi-layer $MoS_2$ flakes required less than 5 seconds and 20 seconds to be converted into monolayers as shown in FIG. 9 panel (b) and FIG. 9 panel (c), respectively). The initial and final height histograms and the corresponding Raman shifts shown in FIG. 9 suggest that the self-limiting electro-ablation technique yields monolayer $MoS_2$.

Figure 10:
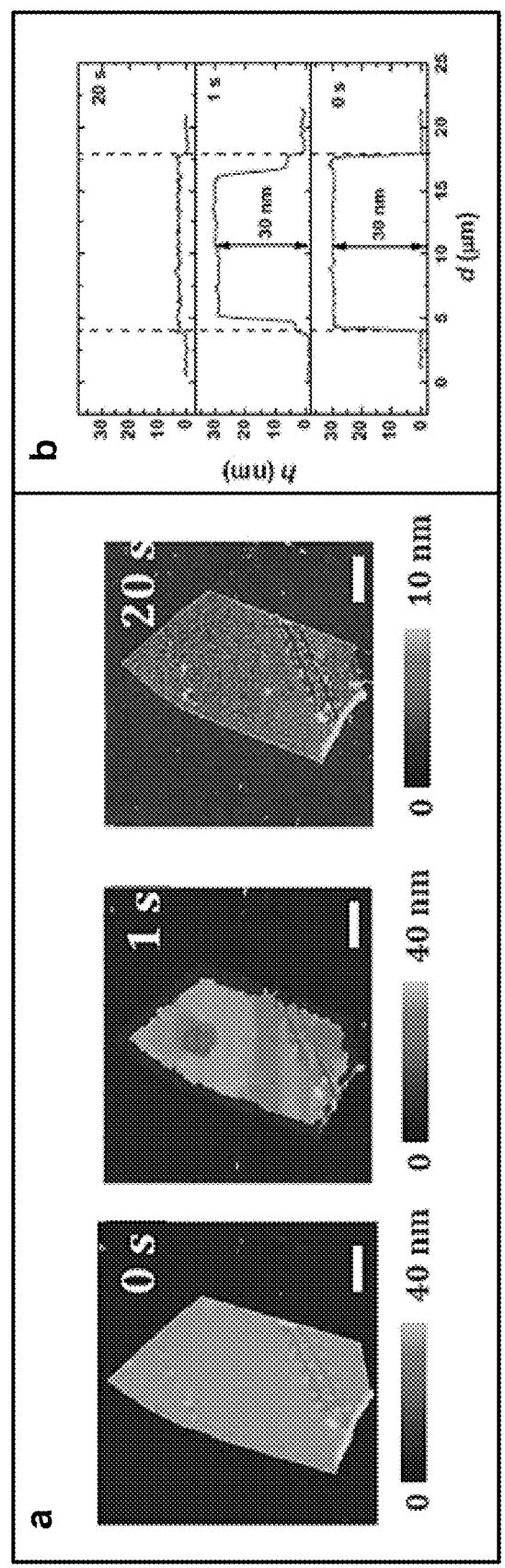
FIG. 10 panel (a) are AFM images of ex-situ characterization of a single $MoS_2$ flake at an intermediate stage of electro-etching, and FIG. 10 panel (b) are line profiles of a $MoS_2$ flake, after electro-etching for 0, 1, and 20 seconds showing both inner unetched (multi-layer) and outer etched (monolayer) portions.

This is one of two distinct features of the electro-ablation technique. First, as discussed earlier, at the end of the electro-ablation treatment, the multi-layer $MoS_2$ flakes are reduced to monolayers irrespective of their initial thicknesses. Second, the electrochemical processes responsible for the conversion of multilayer flakes into monolayers begin at the edges and progressively remove the inner areas with time. Furthermore, the thickness of the undispersed portion of the multi-layer $MoS_2$ flake at any given point in time remains constant and the same as the initial flake thickness. That is, the bottommost monolayer of all the $MoS_2$ flakes are left unaltered by the electro-ablation treatment. For example, FIG. 10 panel (a) includes AFM images of ex-situ characterization of a single $MoS_2$ flake at an intermediate stage of electro-etching, and FIG. 10 panel (b) are line profiles of a $MoS_2$ flake, after electro-etching for 0, 1, and 20 seconds showing both inner unetched (multi-layer) and outer etched (monolayer) portions.

This is why the electro-ablation treatment provides monolayers of $MoS_2$. Such a self-limiting electrochemical process is an outcome of several essential contributing factors. These include strong covalent bonding interactions of the monolayer $MoS_2$ with the substrate, weak van der Waals interaction between the individual layers of $MoS_2$, and electric-field induced differences in the Gibbs free energy of solvation of $MoS_2$ in aqueous electrolytes. The effective thickness of the $MoS_2$ monolayer flakes ($d_{eff}$) increases monotonically with the processing time due to the weak etching of the TiN substrate ($d_{eff}=d_{ML}+d_{etch}$, where $d_{ML}$ is the true monolayer thickness of $MoS_2$ and $d_{ad}'$ is the thickness of uncovered TiN substrate etched during the electro-ablation treatment).

Figure 11:
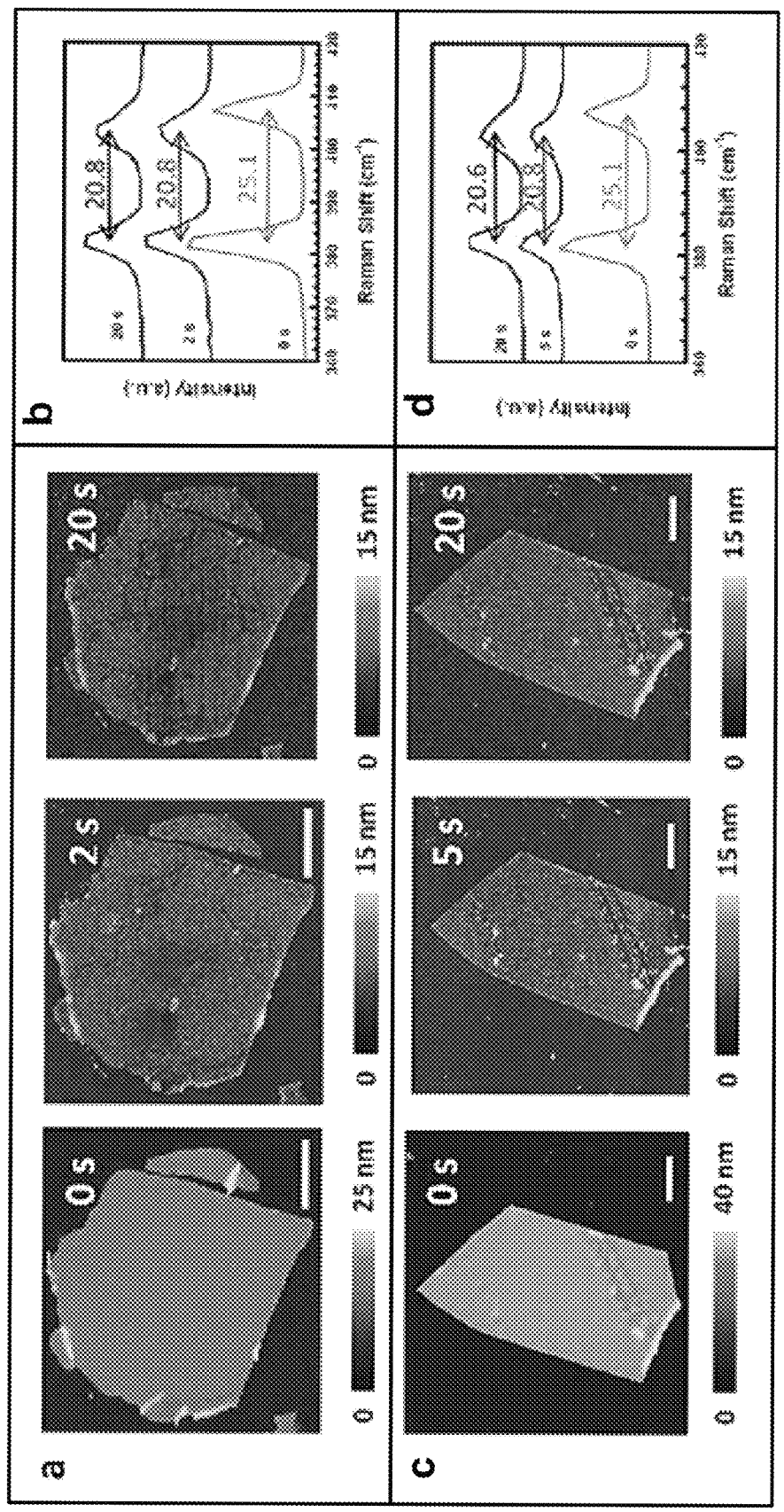
FIG. 11 panel (a) are AFM images and FIG. 11 panel (b) is a Raman spectra of $MoS_2$ flakes with a starting thickness of 13.5 nm for different durations of the electro-etching, and FIG. 11 panel (c) are AFM images and FIG. 11 panel (d) is a Raman spectra of $MoS_2$ flakes with a starting thickness of 29 nm for different durations of the electro-etching.

As expected $d_{etch}$ increases with time. Moreover, thinner flakes are ablated to monolayers faster than thicker flakes because less volume of the material has to be removed. Also, once a multilayer flake is converted to a monolayer one, it remains unaltered (except for the fact that its effective thickness increases with time due to the etching of the substrate) for the rest of the processing time. This behavior makes the electro-ablation technique self-limiting. For example, FIG. 11 panel (a) are AFM images and FIG. 11 panel (b) is a Raman spectra of $MoS_2$ flakes with a starting thickness of 13.5 nm. Furthermore, FIG. 11 panel (c) are AFM images and FIG. 11 panel (d) is a Raman spectra of $MoS_2$ flakes with a starting thickness of 29 nm. For both the $MoS_2$ flakes it is observed that once the $MoS_2$ flakes are ablated to monolayer (Raman shift ~20.6 cm-1) the etching process stops or self-limits.

Figure 12:
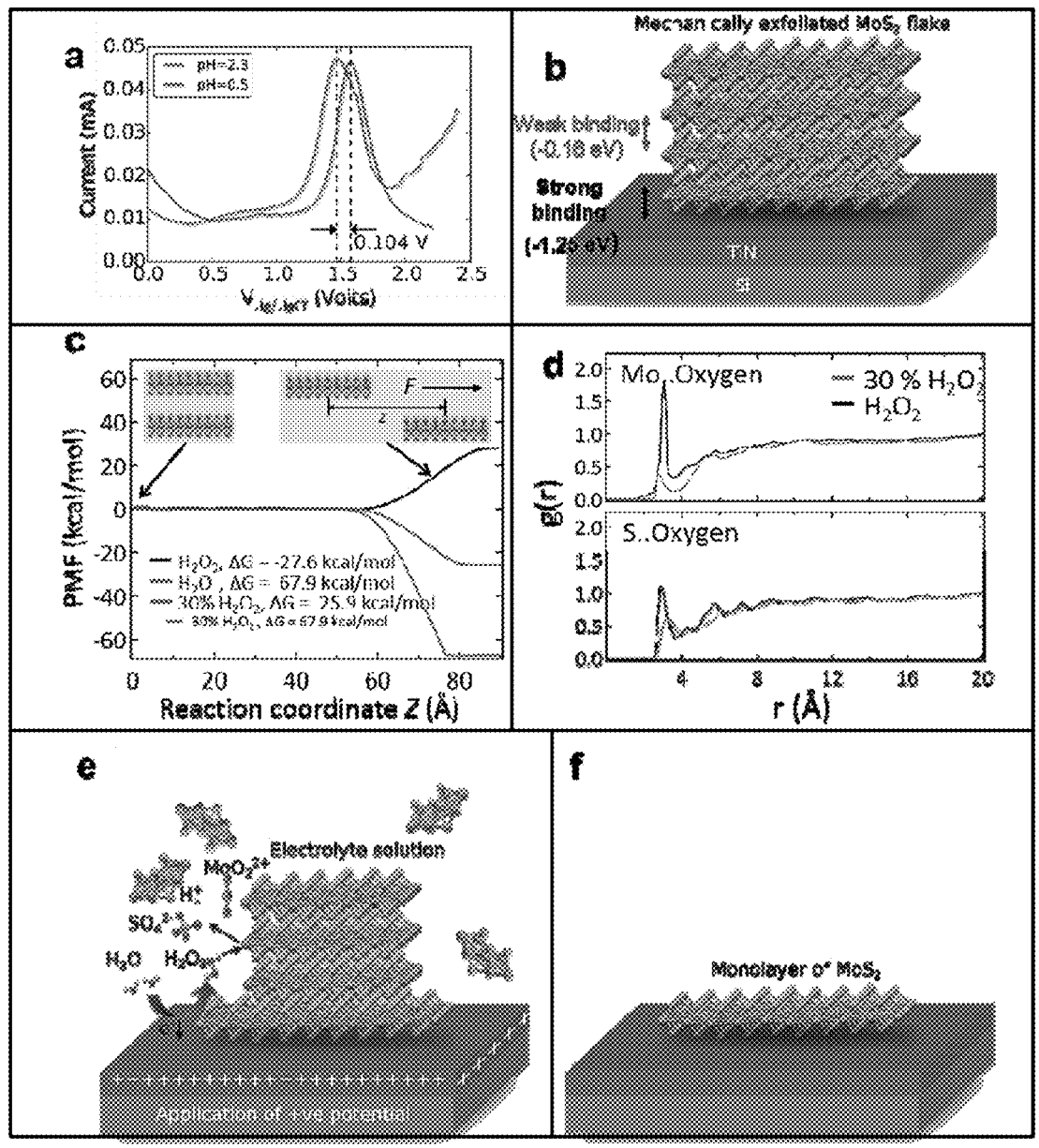
FIG. 12 shows various stages of the electro-etching method of FIG. 3 for forming 2D $MoS_2$ monolayers.

The underlying atomistic pathway behind the self-limiting electrochemical ablation processes involved in the electro-ablation technique is explained in FIG. 12. FIG. 12 panel (a) shows differential pulse voltammetry (DPV) data of a conducting TiN substrate in aqueous electrolyte (1 M lithium chloride) solutions with different pH values (0.5 and 2.3). The peak at approx. 1.6 Volts (with respect to the Ag/AgCl reference electrode) for pH=0.5 and the shift of the peak to a lower potential (approx. 1.5 V) at a higher pH value is consistent with the electrochemical reaction sufficient to oxidize TiN to $TiO_2$. Examination of standard electrode potentials for water and chloride ion reveals oxidation events that are also close to 1.5 Volts and produce reactive species, like $O_2$, $H_2O_2$, $Cl_2$ and other soluble products (e.g., HClO, $HClO_2$, $ClO_2^-$, $ClO_3^-$, $ClO_4^-$). When the electro-ablation technique is applied on $MoS_2$ coated TiN substrates or any other multi-layer TMDC coated on any conductive substrate as described herein, any one (or more) of these reactive species may be responsible for ablating the multilayers of $MoS_2$ to monolayers and for etching the exposed surface of the TiN substrate prior to its oxidation to $TiO_2$.

Figure 13:
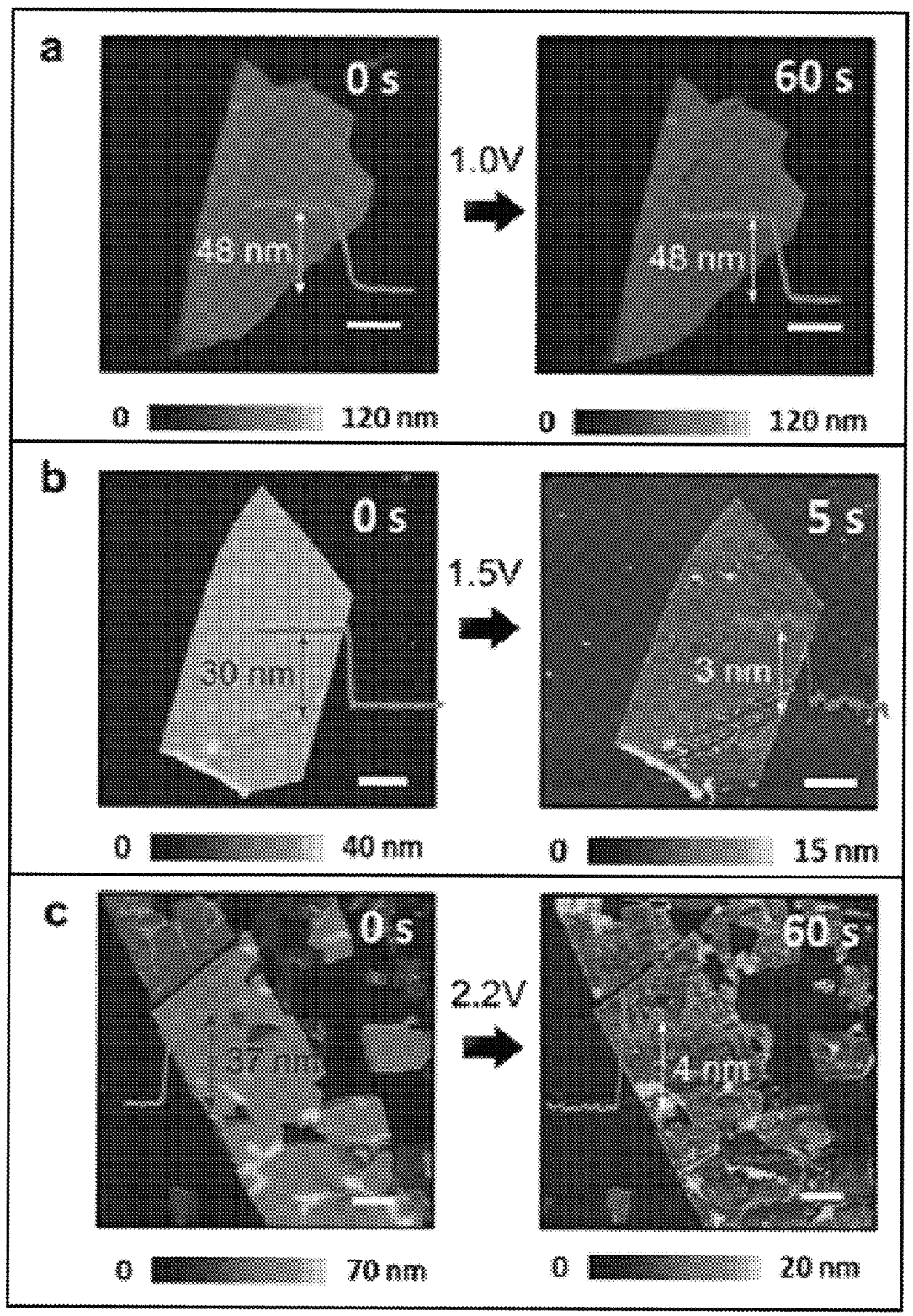
FIG. 13 are AFM images of $MoS_2$ flakes before and after the electro-etching process performed at electrode potentials of 1.0 Volts (FIG. 13 panel (a)), 1.5 Volts (FIG. 13 panel (b)), and 2.2 Volts (FIG. 13 panel (c)).

Once the entire exposed surface is oxidized, the electrochemical reactions involved in the electro-ablation process stopped. It was confirmed that the electro-ablation technique is driven by electrochemical phenomena by carrying out the reactions at electrode potentials below and above the peak value of 1.5 V (pH=2.3). It was also observed that the electro-ablation technique generally works when the applied electrode potential is at and above the peak potential. For example, FIG. 13 are AFM images of $MoS_2$ flakes before and after the electro-etching process performed at potentials of 1.0 Volts (FIG. 13 panel (a)), 1.5 Volts (FIG. 13 panel (b)), and 2.2 Volts (FIG. 13 panel (c)). No electro-ablation is observed at 1.0 Volts. The multilayer flakes are converted to monolayers only when the electrode potential is greater than 1.5 V (oxidation potentials for TiN to $TiO_2$ and $H_2O$ to $H_2O_2$ reactions). However, the electro-ablation may be lowered, for example to about 0.5 Volts by varying the pH of the electrolyte and/or a temperature thereof.

Figure 14A:
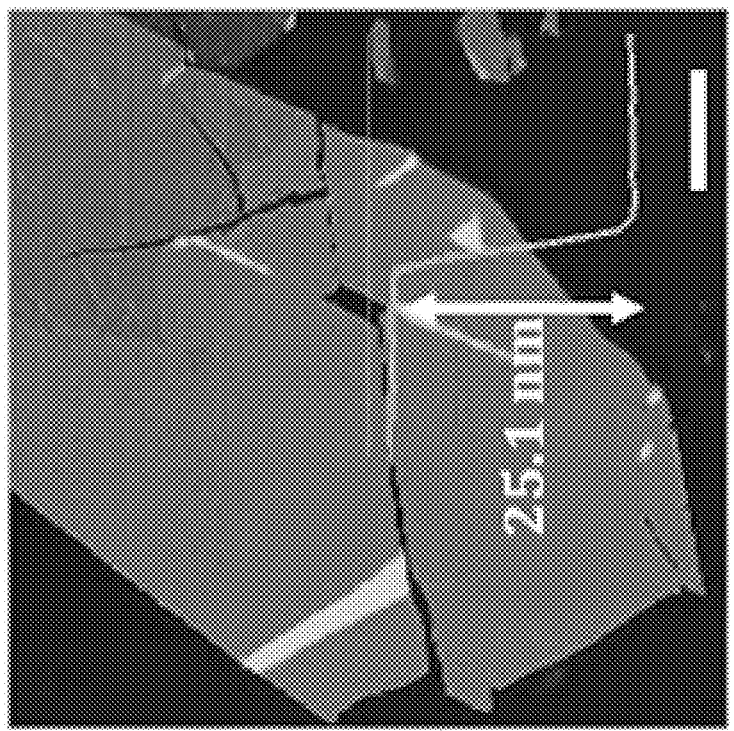
FIG. 14A is an AFM image of $MoS_2$ flakes exfoliated on a passivated titanium nitride (TiN) substrate before the electro-ablation treatment of FIG. 3
Figure 14B:
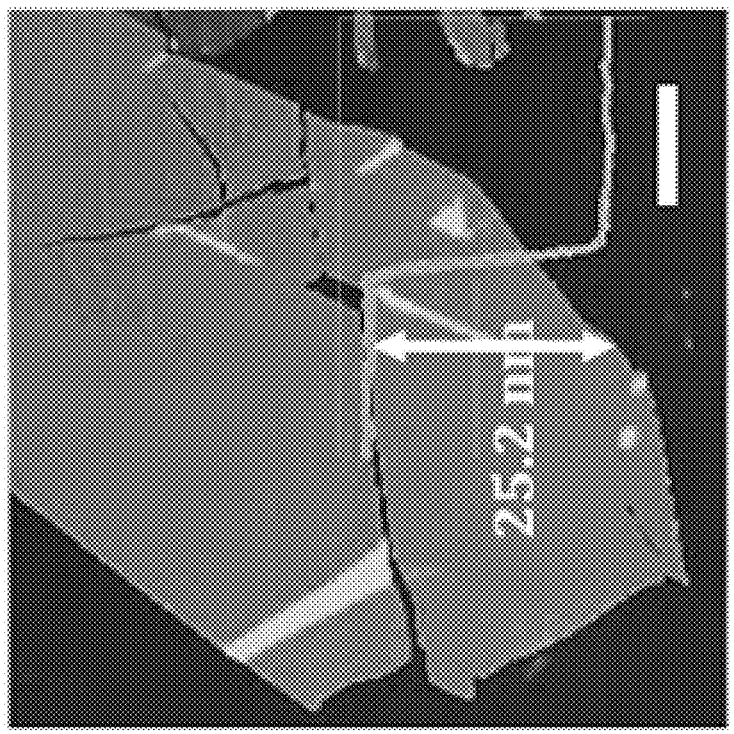
FIG. 14B is an AFM image after the electro-ablation treatment.

The electro-ablation technique was also performed on $MoS_2$ flakes exfoliated on a TiN substrate already treated with the electro-ablation technique. FIG. 14A is an AFM image of $MoS_2$ flakes exfoliated on a passivated TiN substrate before the electro-etching treatment of FIG. 3 and FIG. 14B is an AFM image after the electro-ablation treatment. The AFM measurements show no change in the thicknesses of the $MoS_2$ layers due to electro-ablation treatment after the passivation of TiN to $TiO_2$. Among the possible soluble reactive species (mentioned above) formed at the TiN surface as a result of electrochemistry, $Cl_2$ and other soluble products of the oxidation of $Cl^-$ were ruled out because the electro-ablation process occurs in a 0.3 M $HNO_3$ electrolyte solution. $O_2$ was also ruled out because $MoS_2$ does not react with $O_2$ at room temperature and atmospheric pressure. Hence, the most probable oxidation product is $H_2O_2$. Its electrochemical formation at the TiN surface by the application of an electrode potential of 1.5 V (pH=2.3) and higher is responsible for not only the ablation process of $MoS_2$ but also for etching and passivation of TiN to $TiO_2$. For example, the $MoS_2$ flakes (especially defect and edge sites) in contact with $H_2O_2$ may spontaneously undergo the reaction:

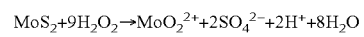
$$MoS_2+9H_2O_2\rightarrow MoO_2^{2+}+2SO_4^{2-}+2H^++8H_2O$$

This reaction leads to the formation of smaller flakes, which undergo an exfoliation process in an $H_2O_2$ rich environment, mimicking an ablation process.

The self-limiting aspect of the electro-ablation technique arises due to differences in the binding energetics between the $TiN/MoS_2$ and $MoS_2/MoS_2$ interfaces. To understand and quantify these differences, density functional theory (DFT) calculations were employed to determine whether it is energetically more favorable for a monolayer of $MoS_2$ to bind with a TiN substrate rather than another layer of $MoS_2$. These calculations are performed in the generalized gradient approximation (GGA) using the projector-augmented wave formalism as implemented in the Vienna Ab-initio Simulation Package (VASP). The exchange correlation is described by the Perdew-Burke-Ernzerhof (PBE) functional.

It was verified that the PBE functional reproduces the lattice parameters of monolayer $MoS_2$, and rocksalt TiN within 1% of their experimental values. The plane wave energy cutoff is set to 500 eV, while the Brillouin zone (BZ) is sampled by a Γ-centered Monkhorst-Pack grid. A k-grid of 8×8×1 is used for monolayer/bilayer $MoS_2$, while a 6×10×1 grid is employed for TiN slabs as well as the TiN—$MoS_2$ configurations. During geometry optimizations, the atomic coordinates are optimized using a conjugate gradient algorithm until the force components on each atom is <0.01 eV/atom. To describe the van der Waals interactions between two $MoS_2$ monolayers, a DFT-D2 method was used. This technique in conjunction with PBE functional generally reproduces the experimental interlayer $MoS_2$ spacing with deviations of <1%.

To serve as a reference for the binding energy calculations, the atomic coordinates of (a) a TiN slab (rocksalt crystal structure) oriented with its surface normal pointing along the crystallographic 111 direction, and (b) monolayer $MoS_2$ in the framework of DFT, were optimized. For the TiN slab, 9 bilayers of TiN in an orthorhombic ($\sqrt{3}\times 1$) supercell, wherein each layer contains 2 Ti or 2 N atoms, and the bottom 5 layers are fixed to simulate the bulk. For monolayer $MoS_2$, an orthorhombic supercell containing 2 Mo and 4 S atoms was employed.

Figure 15:
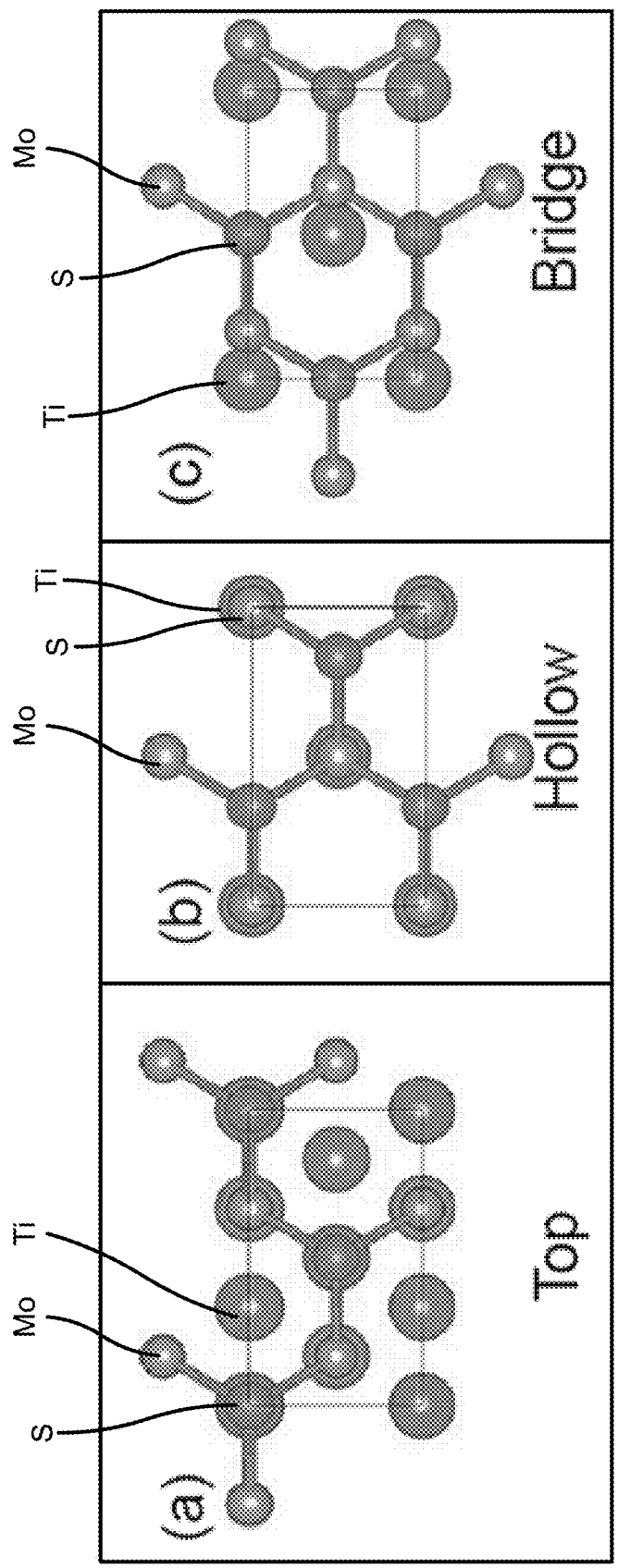
FIG. 15 are atomic configurations for $MoS_2$ monolayer binding on TiN (111) slab containing Ti atoms in the outermost layer closest to the S plane of $MoS_2$, showing three possible sites for attachment of sulfur (S) atoms to the top layer of TiN (111) namely top (FIG. 8 panel (a)), hollow (FIG. 8 panel (b)), and bridge (FIG. 8 panel (c)). Only the Ti atoms in the outermost layer of the TiN (111) slab are shown for clarity.

Next, the most energetically favorable binding configuration for monolayer $MoS_2$ on TiN (111) were identified by investigating 6 different configurations. In three of these systems, Ti layer of TiN (111) slab is closest to the S of $MoS_2$, while in the remaining three N layer of TiN (111) slab neighbors S of $MoS_2$. In both these cases (i.e., Ti or N being the surface layer of TiN slab), the S layer of $MoS_2$ is placed at three distinct sites in the surface layer of TiN slab, namely, hollow, top, and bridge, as shown in FIG. 15. Three possible sites for attachment of S atoms to the top layer of TiN (111) were investigated, namely (a) top, (b) hollow, and (c) bridge. Only the Ti atoms in the outermost layer of the TiN (111) slab are shown for clarity. The Mo atoms are shown as purple spheres, while S atoms are shown in yellow. In addition to these 3 configurations, the TiN (111) slab containing N atoms in the outermost layer were also investigated with the S atoms placed at top, hollow and bridge sites.

In all these configurations, a strain of <4% is applied to the $MoS_2$ monolayer to ensure epitaxy with the underlying TiN slab. For each of these 6 configurations, the binding energy ($E_b$) between TiN slab and $MoS_2$ monolayer is computed as:

$$E_b = E_s - E_{TiN} - E_{MoS2} \quad (1)$$

In equation (1), Es is the total energy of the relaxed TiN—$MoS_2$ system in one of the 6 different configurations, while $E_{TiN}$ and $E_{MoS2}$ refer to the total energies of optimized TiN slab and $MoS_2$ monolayer. Similarly, the binding energy between two $MoS_2$ monolayers is given by:

$$E_b = E_s - 2E_{MoS2} \quad (2)$$

where $E_s$ is the total energy of bilayer $MoS_2$ (following the stacking sequence in bulk $MoS_2$). The computed binding energies for the various configurations are shown in Table 1.

TABLE 1

Binding energy of $MoS_2$ on TiN (111) slab in various configurations. The closest vertical spacing between the $MoS_2$ monolayer and the top layer of TiN (111) slab d is also provided for those configurations which resulted in the binding (i.e., negative values of binding energy)

| Site | Binding Energy | D(angstrom) |
|---|---|---|
| Ti outermost layer | | |
| Top | −1.10 | 2.44 |
| Hollow | −1.25 | 1.76 |
| Bridge | −0.92 | 2.07 |
| N outermost layer | | |
| Top | 2.25 | |
| Hollow | 0.55 | |
| Bridge | 0.58 | |

As indicated by Table 1, it was found that the binding energy $E_b$ is highest (most negative) when the $MoS_2$ monolayer binds onto TiN slab containing Ti atoms in its outermost layer such that the closest S atoms in $MoS_2$ lie in the hollow sites. In this configuration, there is a strong covalent interaction between $MoS_2$ and TiN as indicated by the value of $E_b=-1.25$ eV. In comparison, the DFT calculations performed herein show that the binding energy between two $MoS_2$ monolayers is much lower (−0.16 eV) owing to weak van der Waals interactions. Evidently, it is energetically preferable for monolayer $MoS_2$ to bind to the underlying TiN substrate rather than to another $MoS_2$ layer.

Considering that the binding of $MoS_2$ to the underlying substrate is much stronger than that between the $MoS_2$ layers, the DFT calculations suggest that it is energetically much more favorable to exfoliate $MoS_2$ (all layers except the one strongly bound to the substrate) by overcoming the weak van der Waals interactions between the layers (FIG. 12 panel (b)).

Figure 16:
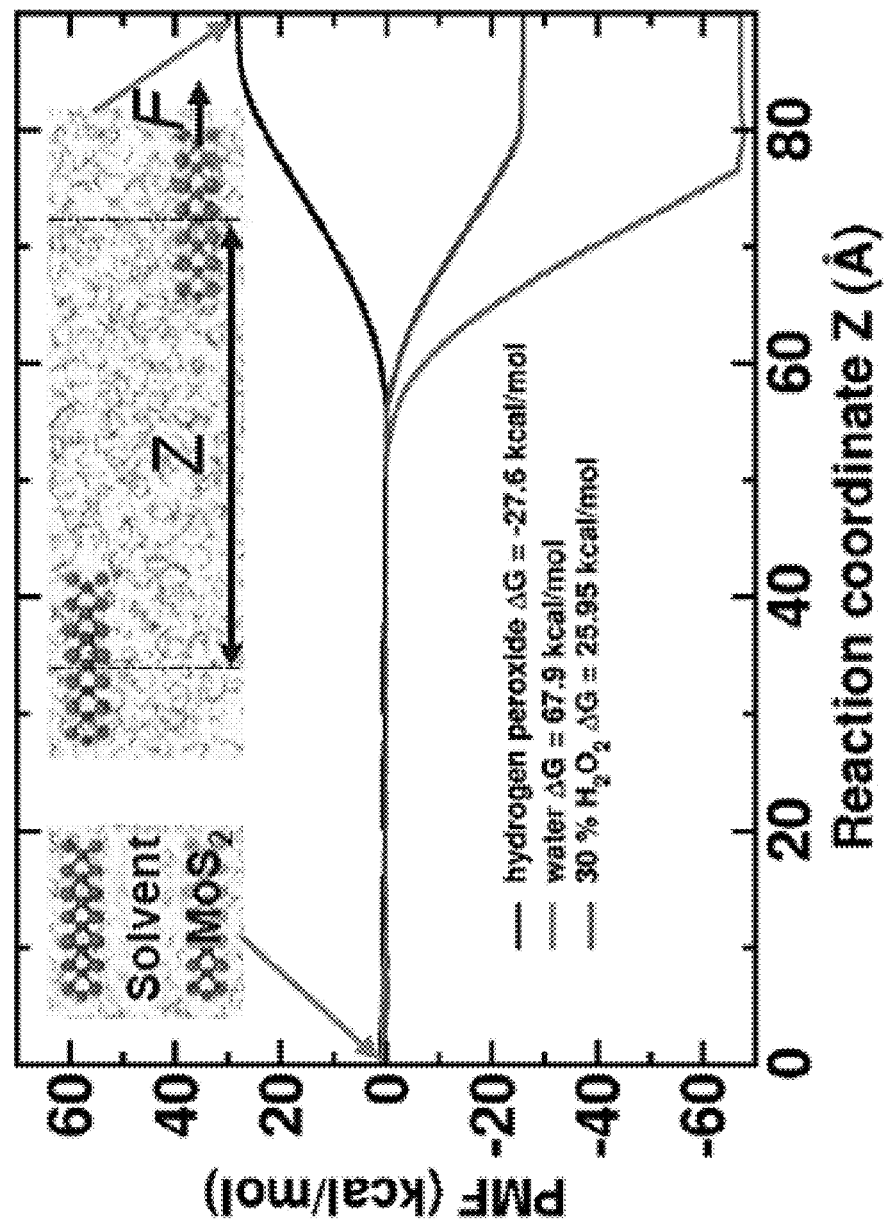
FIG. 16 is a plot of ABF-MD calculations showing the variation in potential of mean force (kcal/mol) in various solvents. The initial (left) and the final (right) configurations for a typical run are shown as insets.

Referring also now to FIG. 16, to provide a thermodynamic foundation for the electro-ablation method, the Adaptive Bias Force (ABF) method was employed to determine the free energies of exfoliation and dispersion of $MoS_2$ in water and hydrogen peroxide, including a 30% $H_2O_2$ solution corresponding to the commercially available peroxide reagent. As an initial model construct a bilayer $MoS_2$ sheet (FIG. 16, inset) was considered. As part of the ABF algorithm, an external biasing force, estimated locally from the sampled conformations of the system and updated continuously, is applied at each step to facilitate the system in overcoming significant energy barriers, if present along the reaction coordinate. This force is applied to one of the $MoS_2$ sheet in the z-direction such that the sheets are tangentially separated.

An orthorhombic computational supercell was employed with dimensions of 80 angstrom (Å)×80 Å×200 Å; the heterogeneous condensed phase occupies an 80 Å×80 Å×80 Å region. The number of solvent molecules in each box was selected to reproduce the density of water or hydrogen peroxide by isothermal-isobaric (NPT) simulations at 1 atmosphere and 300 Kelvin. A sufficiently large cut-off distance of 14 Å was employed. Initial configurations for each system were generated using Packmol. Subsequently the atomic coordinates were optimized for 5000 steps via steepest descent algorithm followed by molecular dynamic (MD) simulations. During these molecular dynamic runs, systems were equilibrated over a time period of 10 nanoseonds in NVT ensemble, with another production of 20 nanoseconds, followed by the ABF calculation in the NVT canonical ensemble for 30 ns for each window (6 windows of 15 Å). The SPC/E force field was used for water and AMBER modified potential for hydrogen peroxide, respectively.

The potential of mean force profiles for the $MoS_2$ exfoliation in the three systems are presented in FIG. 12 panel (c). The free energy of exfoliation is based on the difference between the free energy of the bilayer in the solvent (FIG. 12 panel (c), left inset) and the individual layers dispersed in the solvent (FIG. 12 panel (c), right inset). The calculated free energy of exfoliation of $MoS_2$ in water and 30% $H_2O_2$ solution were positive and, hence, these solvents do not assist in the exfoliation and dispersion mechanism. However, a negative free energy of exfoliation is obtained as the pure $H_2O_2$ limit is approached, suggesting that exfoliation is thermodynamically feasible. The pair distribution functions were also evaluated in FIG. 12 panel (d) to understand the atomistic interactions that assist the exfoliation of $MoS_2$.

FIG. 12 panel (d) (top) shows that the interactions of Mo with the O atoms of $H_2O_2$ are much more pronounced in comparison to the Mo-O interactions of water and the dilute (30%) $H_2O_2$.

Furthermore, the S atoms also interact more favorably with the O atoms in the pure $H_2O_2$ environment than in the dilute solution. Together, these interactions drive the electro-ablation $MoS_2$ in an $H_2O_2$-rich solution to completion, leaving behind the monolayers. The overall kinetics of the electro-ablation process is shown schematically in FIG. 12 panels (e-f). The choice of TiN as the conductive substrate for the electro-ablation process is motivated by our observation that TiN appears to facilitate the oxidation of $H_2O$ to $H_2O_2$ as its surface is oxidized to $TiO_2$.

Figure 17:
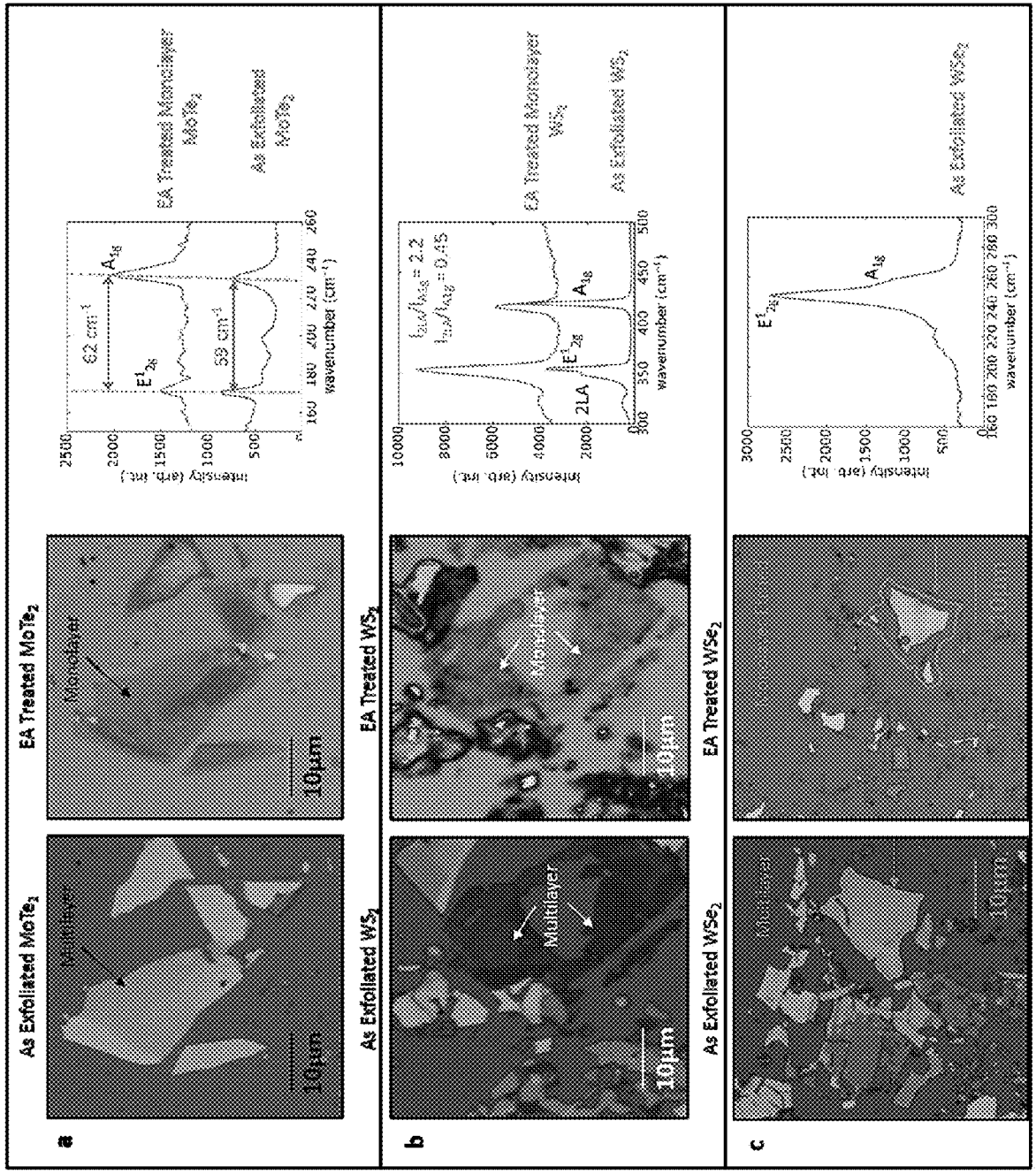
FIG. 17 are optical images and Raman spectra of molybdenum telluride ($MoTe_2$) (FIG. 17, panel (a)), tungsten sulfide ($WS_2$) (FIG. 17 panel (b)) and tungsten selenide ($WSe_2$) (FIG. 17 panel (c)) flakes before and after the application of the electro-ablation technique. Monolayers are successfully obtained for $MoTe_2$ (the separation between the $A_{1g}$ and $E^1_{2g}$ peaks changes from 59 $cm^{-1}$ to 62 $cm^{-1}$) and $WS_2$ (the intensity ratio of the 2LA peak and the $A_{1g}$ peak changes from 0.45 to 2.2).

FIG. 17 are optical images and Raman spectra of $MoTe_2$ (FIG. 17, panel (a)), $WS_2$ (FIG. 17 panel (b)) and $WSe_2$ (FIG. 17 panel (c)) flakes before and after the application of the electro-ablation technique. Monolayers are successfully obtained for $MoTe_2$ (the separation between the $A_{1g}$ and $E^1_{2g}$ peaks changes from 59 $cm^{-1}$ to 62 $cm^{-1}$) and $WS_2$ (the intensity ratio of the 2LA peak and the $A_{1g}$ peak changes from 0.45 to 2.2). However, in the case of $WSe_2$, the electro-ablation technique removed the monolayer of $WSe_2$ as well.

This suggests that the binding energies of $WS_2$ and $MoTe_2$ monolayers with TiN substrates are strong and similar in magnitude to the case of $MoS_2$, whereas the binding energy of $WSe_2$ monolayers with the TiN substrate is much weaker. However, this may be addressed by replacing the TiN substrate with another conducting substrate having a higher binding energy with $WSe_2$ monolayer in contact therewith, for example TiW, ZrN, NbN, TaN, WN, etc.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "example" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method of forming a TMDC monolayer, comprising:
   providing a multi-layer transition metal dichalcogenide (TMDC) film, the multi-layer TMDC film comprising a plurality of layers of the TMDC;
   positioning the multi-layer TMDC film on a conducting substrate;
   contacting the conducting substrate and the multi-layer TMDC film with an electrolyte solution;
   applying a predetermined electrode potential on the conducting substrate for a predetermined time; and
   removing, by application of the predetermined electrode potential, a portion of the plurality of layers of the TMDC included in the multi-layer TMDC film, thereby leaving a TMDC monolayer film positioned on the conducting substrate.

2. The method of forming a TMDC monolayer of claim 1, wherein the TMDC comprises molybdenum disulfide, tungsten disulfide, tungsten diselenide or molybdenum ditelluride.

3. The method of forming a TMDC monolayer of claim 2, wherein the conducting substrate comprises titanium nitride.

4. The method of forming a TMDC monolayer of claim 1, wherein the electrolyte solution comprises an alkali metal salt.

5. The method of forming a TMDC monolayer of claim 4, wherein the alkali metal salt comprises at least one of lithium chloride, lithium nitride, sodium chloride and potassium chloride.

6. The method of claim 1, wherein the electrolyte solution comprises a dilute acid.

7. The method of forming a TMDC monolayer of claim 1, wherein the predetermined electrode potential is greater than an oxidation potential of water to hydrogen peroxide.

8. The method of forming a TMDC monolayer of claim 7, wherein the predetermined electrode potential is in a range of 0.5 Volts to 2.0 Volts with respect to a silver/silver chloride reference electrode.

9. The method of forming a TMDC monolayer of claim 1, wherein the predetermined time is in a range of 5 seconds to 60 seconds.

10. The method of forming a TMDC monolayer of claim 1, wherein the multi-layer TMDC film has a first thickness of greater than 1 nm, and wherein the TMDC monolayer film has a second thickness of less than 1 nm.

11. A method of forming a transition metal dichalcogenide (TMDC) monolayer, comprising:

obtaining a multi-layer TMDC film from a bulk single crystal TMDC source via mechanical exfoliation, the multi-layer TMDC film comprising a plurality of layers of the TMDC;

positioning the multi-layer TMDC film on a conducting substrate;

contacting the conducting substrate and the multi-layer TMDC film with an electrolyte solution;

applying a predetermined electrode potential on the conducting substrate for a predetermined time; and removing, by application of the predetermined electrode potential, a portion of the plurality of layers of the TMDC included in the multi-layer TMDC film, thereby leaving a TMDC monolayer film positioned on the conducting substrate.

12. The method of forming a TMDC monolayer of claim 11, wherein the TMDC comprises molybdenum disulfide, tungsten disulfide, tungsten diselenide or molybdenum ditelluride.

13. The method of forming a TMDC monolayer of claim 11, wherein the conducting substrate comprises titanium nitride.

14. The method of forming a TMDC monolayer of claim 11, wherein the electrolyte solution comprises an alkali metal salt.

15. The method of forming a TMDC monolayer of claim 14, wherein the alkali metal salt comprises at least one of lithium chloride, lithium nitride, sodium chloride and potassium chloride.

16. The method of forming a TMDC monolayer of claim 11, wherein the predetermined electrode potential is greater than an oxidation potential of water to hydrogen peroxide.

17. The method of forming a TMDC monolayer of claim 16, wherein the predetermined electrode potential is in a range of 0.5 Volts to 2.0 Volts with respect to a silver/silver chloride reference electrode.

18. The method of forming a TMDC monolayer of claim 11, wherein the predetermined time is in a range of 5 seconds to 60 seconds.

19. A method, comprising:

positioning an adhesive strip on a bulk single crystal TMDC source;

removing the adhesive strip from the bulk single crystal TMDC source such that a TMDC film remains adhered to the adhesive strip, the TMDC film comprising a plurality of multi-layer TMDC flakes, each multi-layer TMDC flake of the plurality of TMDC flakes comprising a plurality of TMDC layers;

positioning the adhesive strip on a conducting substrate such that the TMDC film contacts the conductive substrate;

heating the conducting substrate to a predetermined temperature for a predetermined heating time;

immersing the conducting substrate and the adhesive strip in a solvent;

sonicating the solvent so as to dissolve the adhesive strip, thereby leaving the TMDC film disposed on the conducting substrate;

contacting the conducting substrate and the multi-layer TMDC film with an electrolyte solution;

applying a predetermined electrode potential on the conducting substrate for a predetermined time; and removing, by application of the predetermined electrode potential, a portion of the plurality of layers of the TMDC included in the multi-layer TMDC film, thereby leaving a TMDC monolayer film positioned on the conducting substrate.

20. The method of claim 19, wherein the TMDC comprises molybdenum disulfide, tungsten disulfide, tungsten diselenide or molybdenum ditelluride.

21. The method of claim 19, wherein the electrolyte solution comprises an alkali metal salt or a dilute acid.

* * * * *